US006720493B1

(12) United States Patent
Strobel et al.

(10) Patent No.: US 6,720,493 B1
(45) Date of Patent: Apr. 13, 2004

(54) RADIATION SHIELDING OF INTEGRATED CIRCUITS AND MULTI-CHIP MODULES IN CERAMIC AND METAL PACKAGES

(75) Inventors: David J. Strobel, Poway, CA (US); David R. Czajkowski, Encinitas, CA (US)

(73) Assignee: Space Electronics, Inc., San Diego, CA (US)

( * ) Notice: Subject to any disclaimer, the term of this patent is extended or adjusted under 35 U.S.C. 154(b) by 0 days.

(21) Appl. No.: 09/456,631

(22) Filed: Dec. 8, 1999

Related U.S. Application Data

(63) Continuation-in-part of application No. 09/375,881, filed on Aug. 17, 1999, now Pat. No. 6,261,508, which is a continuation-in-part of application No. 08/791,256, filed on Jan. 30, 1997, now abandoned, which is a continuation-in-part of application No. 08/372,289, filed on Jan. 13, 1995, now Pat. No. 5,635,754, which is a continuation-in-part of application No. 08/221,506, filed on Apr. 1, 1994, now abandoned.

(51) Int. Cl.$^7$ .................................................. H05K 9/00
(52) U.S. Cl. ...................... 174/35 R; 361/816; 257/660; 257/698
(58) Field of Search .................. 174/35 R, 35 MS; 361/816, 818, 800; 257/659, 660, 698

(56) References Cited

U.S. PATENT DOCUMENTS

| | | | |
|---|---|---|---|
| 3,706,840 A | 12/1972 | Moyle et al. | 174/52 PE |
| 3,771,025 A | 11/1973 | Berner | 317/234 R |
| 3,828,425 A | 8/1974 | Manus | 29/590 |
| 3,914,858 A | 10/1975 | Sonoda et al. | 29/588 |
| 4,089,575 A | 5/1978 | Grabbe | 339/17 |
| 4,091,407 A | 5/1978 | Williams et al. | 357/54 |
| 4,100,675 A | 7/1978 | Landsittel | 29/627 |
| 4,173,683 A | 11/1979 | Comizzoli | 428/447 |
| 4,250,347 A | 2/1981 | Fierkens | 174/52 |
| 4,468,411 A | 8/1984 | Sloan et al. | 427/8 |
| 4,506,108 A | 3/1985 | Kersch et al. | 174/52 |
| 4,614,836 A * | 9/1986 | Carpenter et al. | 174/51 |
| 4,633,573 A | 1/1987 | Scherer | 29/589 |
| 4,639,826 A * | 1/1987 | Val et al. | 361/272 |
| 4,652,465 A | 3/1987 | Koto et al. | 427/216 |
| 4,661,837 A | 4/1987 | Sono | 357/84 |
| 4,663,240 A | 5/1987 | Hajdu et al. | 428/545 |
| 4,687,622 A | 8/1987 | Longden | 376/254 |

(List continued on next page.)

FOREIGN PATENT DOCUMENTS

| | | | |
|---|---|---|---|
| EP | 0160327 | 11/1985 | 250/515.1 |
| EP | 01060327 | 11/1985 | 250/515.1 |
| FR | 2584863 | 1/1987 | |

(List continued on next page.)

OTHER PUBLICATIONS

"Electronics Packaging and Production", p 26–27.
"Electronic materials and Processes, Consulting and Short Courses", p 1–3.
"Electronic Materials Handbook", p 470–483.
"Electronic Packaging and Interconnection Handbook", p6.41–6.49.

(List continued on next page.)

*Primary Examiner*—Hung V. Ngo
(74) *Attorney, Agent, or Firm*—Foley & Lardner

(57) ABSTRACT

A radiation shielded and packaged integrated circuit semiconductor device includes a lid secured to a base to enclose an integrated circuit die within, wherein the lid and the base are each constructed from a high Z material to prevent radiation from penetrating therethrough. Another embodiment includes a die attach slug constructed from a high Z material disposed between the integrated circuit die and the base, in combination with a high Z material lid to substantially block incident radiation.

20 Claims, 36 Drawing Sheets

U.S. PATENT DOCUMENTS

| | | | |
|---|---|---|---|
| 4,769,344 A | 9/1988 | Sakai et al. | 437/216 |
| 4,833,334 A | 5/1989 | Valy et al. | 250/515.1 |
| 4,835,120 A | 5/1989 | Mallik et al. | 437/209 |
| 4,837,448 A | 6/1989 | Sainte Luce Banchelin et al. | 250/519.1 |
| 4,839,716 A | 6/1989 | Butt | 357/74 |
| 4,888,449 A | 12/1989 | Crane et al. | 174/52.4 |
| 4,891,687 A | 1/1990 | Mallik et al. | 357/70 |
| 4,935,174 A | 6/1990 | Suzuki | 264/24 |
| 4,953,002 A | 8/1990 | Nelson et al. | 357/74 |
| 4,967,315 A | 10/1990 | Schelhorn | 361/424 |
| 4,975,762 A | 12/1990 | Stradley et al. | 257/660 |
| 4,979,019 A | 12/1990 | Paquette et al. | 257/690 |
| 5,047,260 A | 9/1991 | Durand | 427/54.1 |
| 5,096,851 A | 3/1992 | Yamazaki et al. | 437/205 |
| 5,138,430 A | 8/1992 | Gow, 3rd et al. | 357/70 |
| 5,139,969 A | 8/1992 | Mori | 437/183 |
| 5,149,662 A | 9/1992 | Eichelberger | 437/8 |
| 5,151,770 A | 9/1992 | Inoue | 357/53 |
| 5,166,772 A | 11/1992 | Soldner et al. | 257/659 |
| 5,180,513 A | 1/1993 | Durand | 252/62.55 |
| 5,202,536 A | 4/1993 | Buonanno | 174/35 GC |
| 5,206,794 A | 4/1993 | Long | 257/675 |
| 5,239,126 A | 8/1993 | Oshiba | 174/35 |
| 5,250,845 A | 10/1993 | Runyan | 257/729 |
| 5,268,331 A | 12/1993 | Abbott | 437/225 |
| 5,294,826 A | 3/1994 | Marcantonio et al. | 257/659 |
| 5,304,750 A | 4/1994 | Schubert et al. | 181/294 |
| 5,317,107 A | 5/1994 | Osorio | 174/52.4 |
| 5,384,477 A | 1/1995 | Bulucea et al. | 257/372 |
| 5,406,117 A | 4/1995 | Dlugokecki et al. | 257/659 |
| 5,424,251 A | 6/1995 | Sono et al. | 437/214 |
| 5,441,900 A | 8/1995 | Bulucea et al. | 437/24 |
| 5,527,742 A | 6/1996 | Weiler et al. | 437/211 |
| 5,552,338 A | 9/1996 | Kang | 437/170 |
| 5,561,265 A | 10/1996 | Livshits et al. | 174/35 GC |
| 5,577,319 A | 11/1996 | Knecht | 29/827 |
| 5,589,129 A | 12/1996 | Kato et al. | 264/437 |
| 5,610,443 A | 3/1997 | Inagaki et al. | 257/788 |
| 5,672,918 A | 9/1997 | Kimbrough et al. | 307/126 |
| 5,714,102 A | 2/1998 | Highum et al. | 264/105 |
| 5,770,304 A | 6/1998 | Nakamura et al. | 428/328 |
| 5,780,163 A | 7/1998 | Camilletti et al. | 428/446 |
| 5,824,568 A | 10/1998 | Zechman | 438/112 |
| 5,825,042 A | 10/1998 | Strobel et al. | 250/515.1 |
| 5,851,852 A | 12/1998 | Ostop et al. | 438/106 |
| 5,864,088 A | 1/1999 | Sato et al. | 174/35 |
| 5,880,403 A | 3/1999 | Czajkowski et al. | 174/35 R |
| 5,888,850 A | 3/1999 | Havens et al. | 438/127 |
| 5,889,316 A | 3/1999 | Strobel et al. | 257/659 |

FOREIGN PATENT DOCUMENTS

| | | | |
|---|---|---|---|
| JP | 54004781 | 7/1980 | |
| JP | 56103452 | 8/1981 | 257/660 |
| JP | 57095650 | 6/1982 | |
| JP | 60106150 | 6/1985 | |
| JP | 60124834 | 7/1985 | |
| JP | 60180150 | 9/1985 | 257/660 |
| JP | 61004249 | 1/1986 | 257/659 |
| JP | 61004250 | 1/1986 | |
| JP | 62125651 | 6/1987 | 257/660 |
| JP | 2237053 | 9/1990 | 257/659 |
| JP | 2278740 | 11/1990 | |
| JP | 4094560 | 3/1992 | 257/660 |
| JP | 4273200 | 9/1992 | |

OTHER PUBLICATIONS

M.P. Baze et al., "Latch–Up Paths in Bipolar Integrated Circuits", IEEE Transactions on Nuclear Science, Dec. 1986, vol. NS–33. No. 6.

A. H. Johnston, et al., "The Effect of Temperature on Single–Particle Latch–Up", IEEE Transactions on Nuclear Science, Dec. 1991, vol. 38, No. 6.

Song et al., "Parametric Investigation of Latch–Up Sensitivity in 1.25 $\mu$m CMOS Technology", IEEE Transactions on Nuclear Science, Dec. 1987, vol. NS–34 No. 6.

M.P. Baze et al., "Latch–Up Paths in Bipolar Integrated Circuits", IEEE Transactions on Nuclear Science, Dec. 1986, vol. NS–33. No. 6.

A. H. Johnston, et al., "The Effect of Temperature on Single–Particle Latch–Up", IEEE Transactions on Nuclear Science, Dec. 1991, vol. 38, No. 6.

Song et al., "Parametric Investigation of Latch–Up Sensitivity in 1.25 $\mu$m CMOS Technology", IEEE Transactions on Nuclear Science, Dec. 1987, vol. NS–34 No. 6.

"Electronics Packaging and Production", p 26–27, no date.

"Electronic materials and Processes, Consulting and Short Courses", p 1–3, no date.

"Electronic Materials Handbook", p 470–483, no date.

"Electronic Packaging and Interconnection Handbook", p6.41–6.49, no date.

* cited by examiner

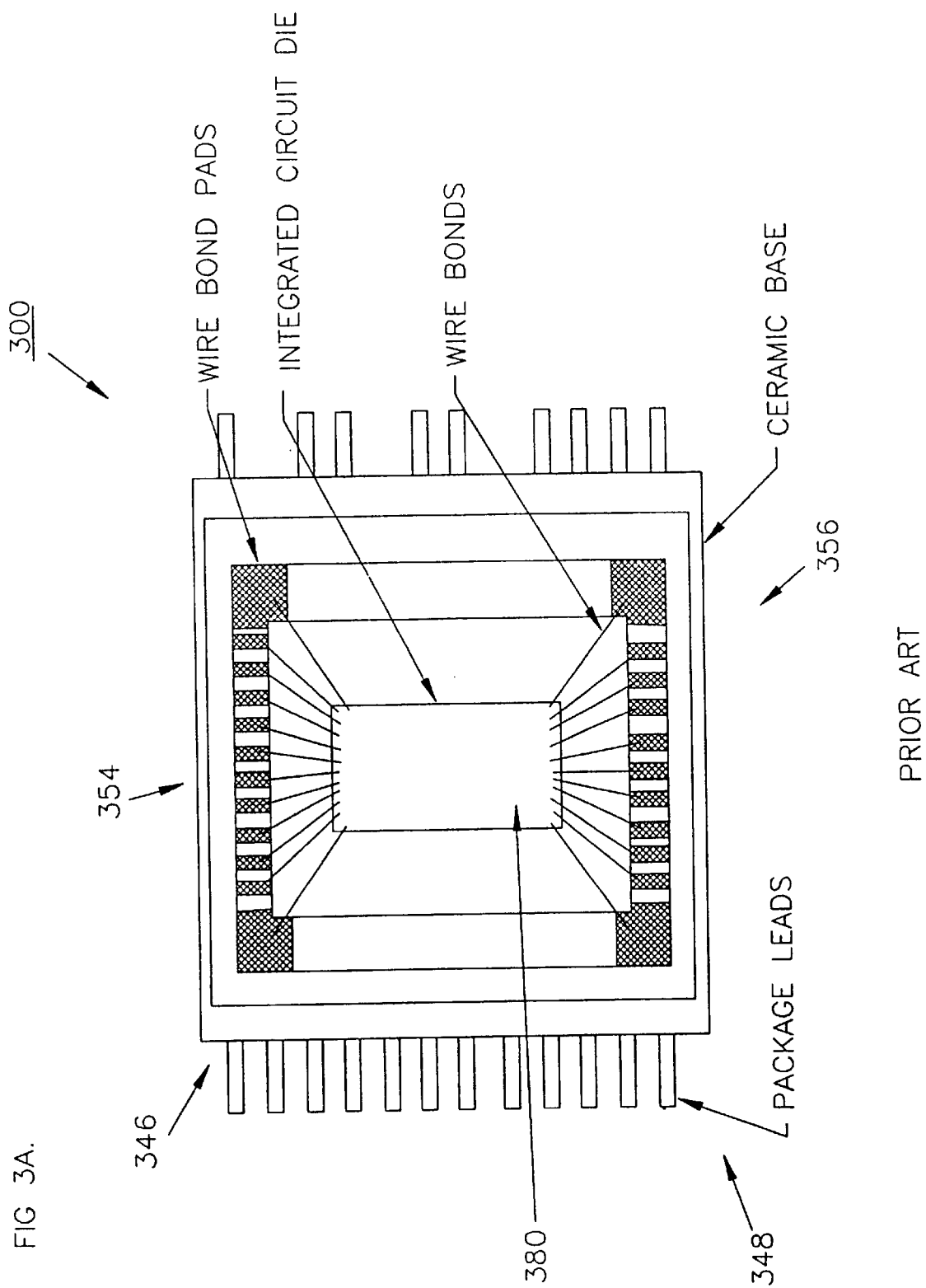

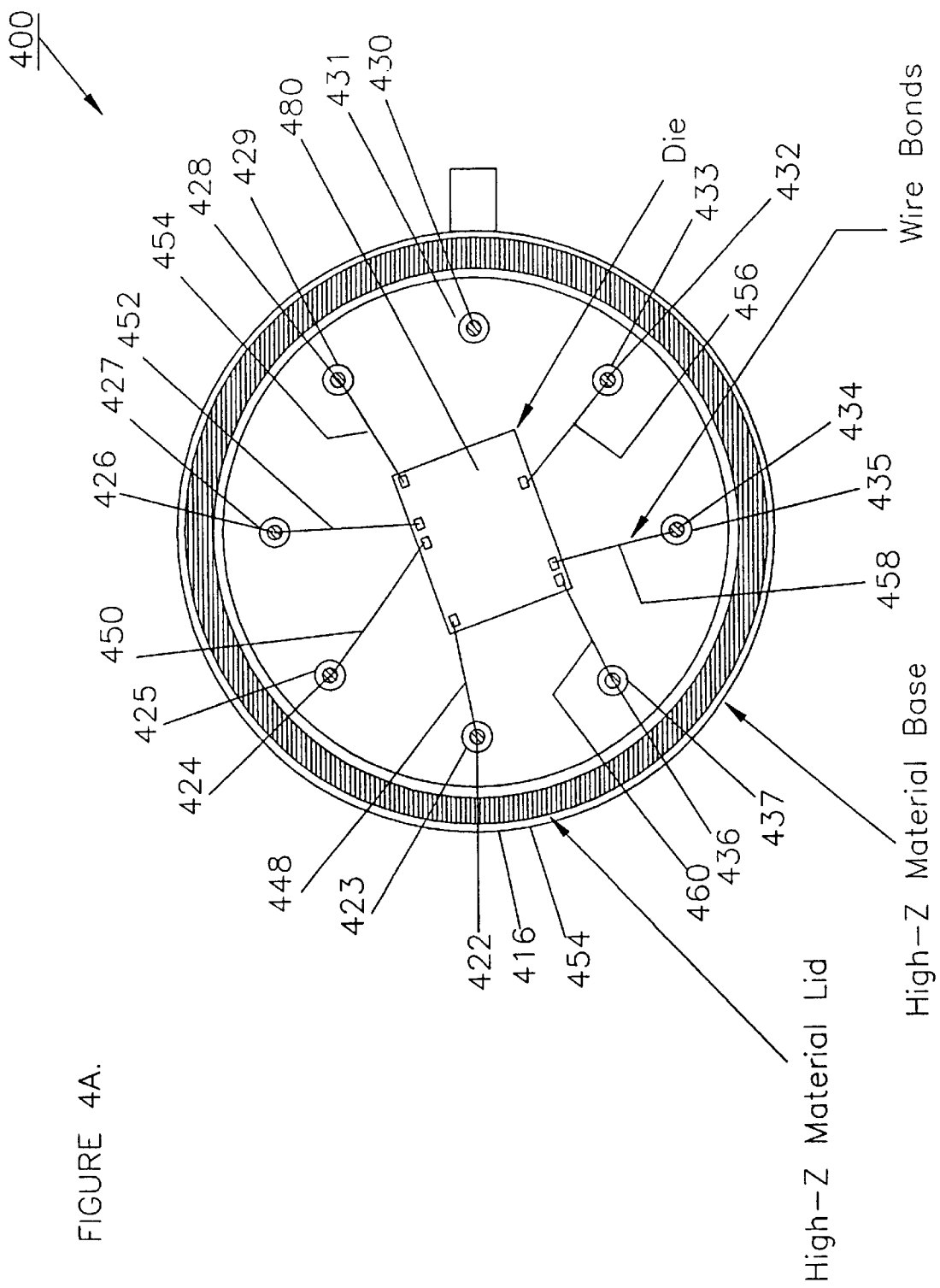

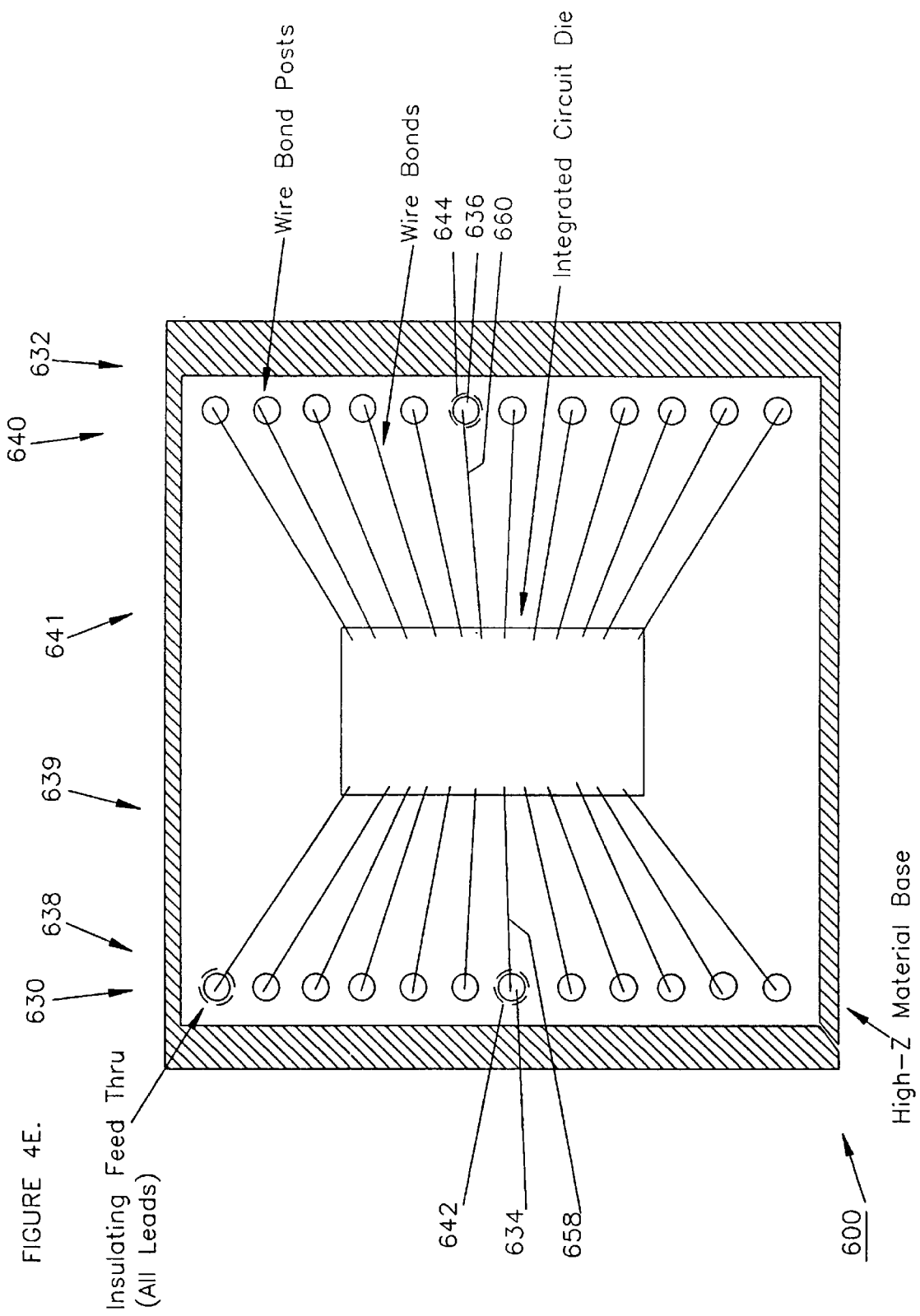

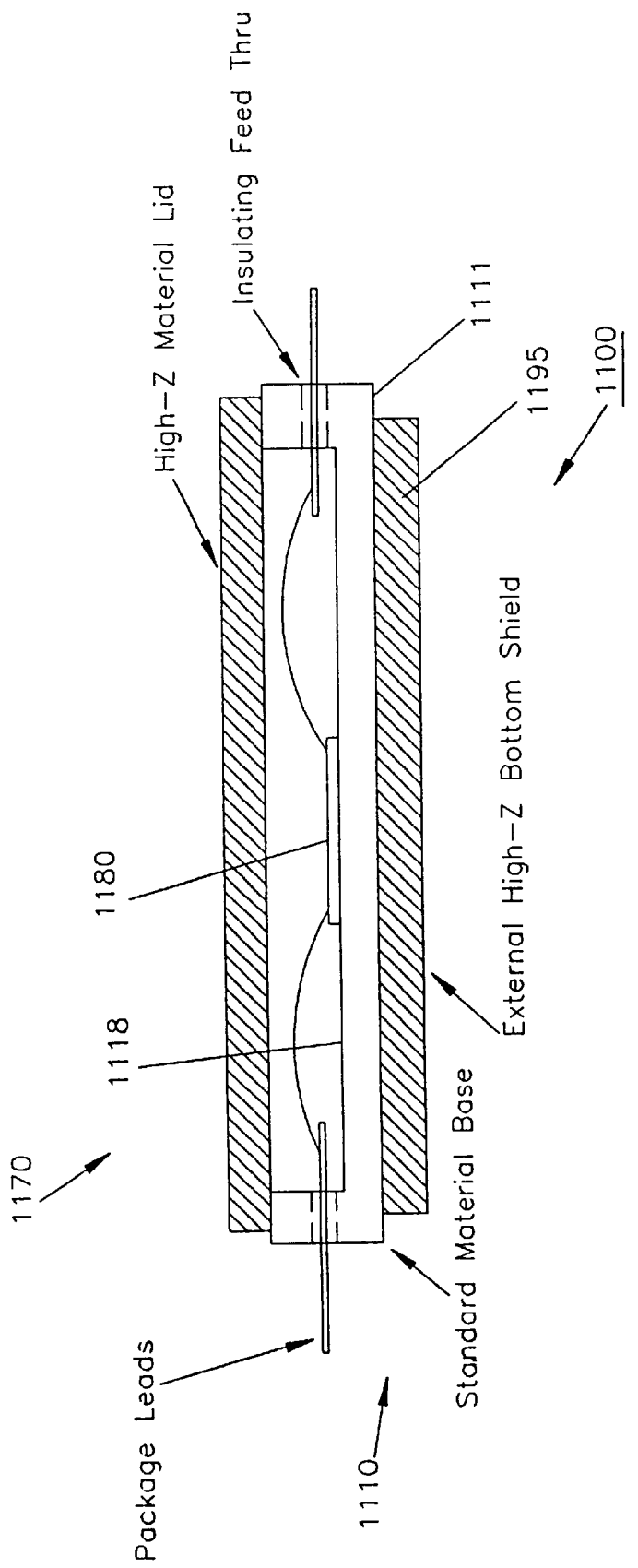

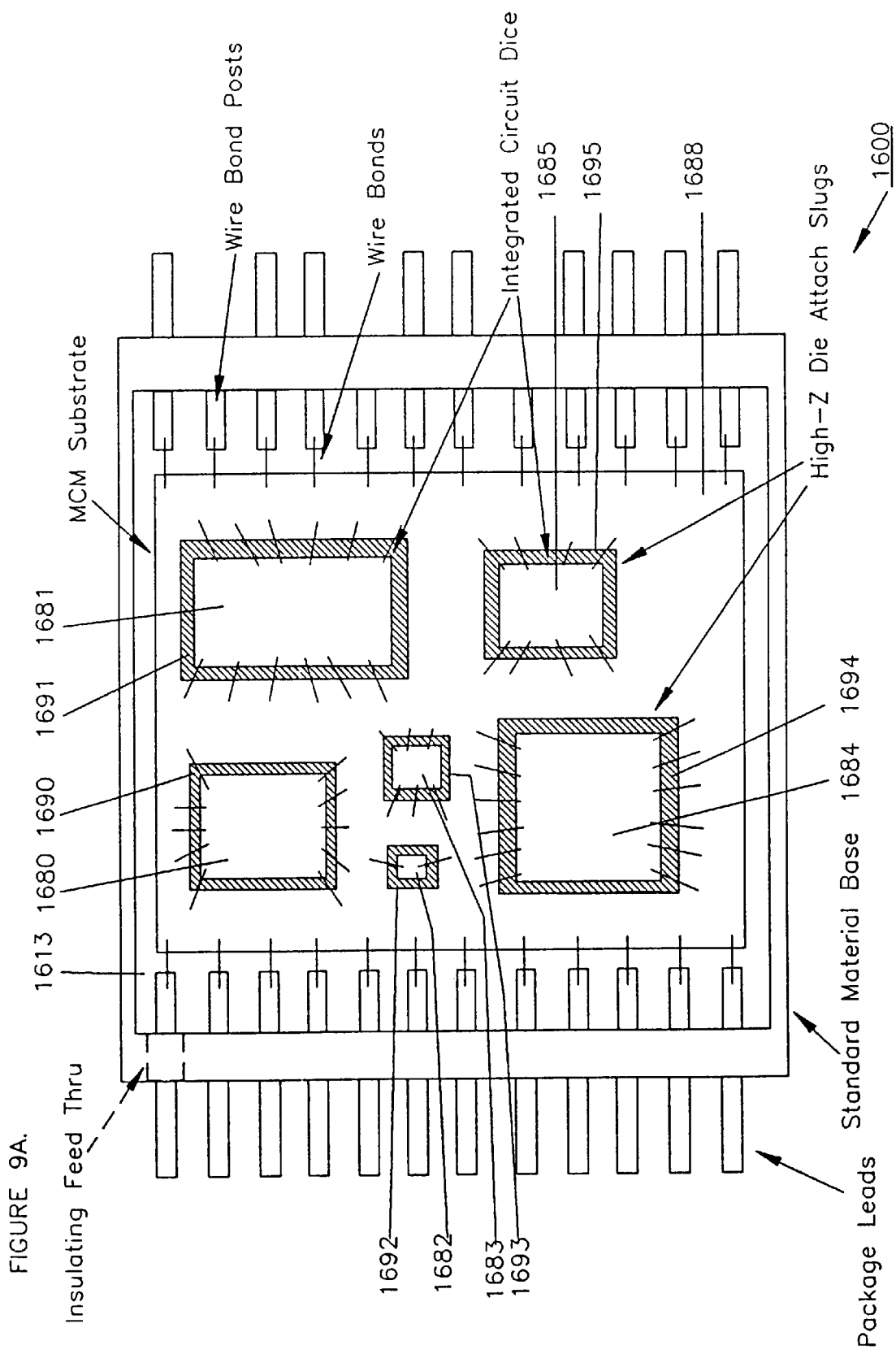

RADIATION SHIELDING OF INTEGRATED CIRCUITS AND MULTI-CHIP MODULES IN CERAMIC AND METAL PACKAGES

CROSS REFERENCE TO RELATED APPLICATIONS

This application is a continuation-in-part patent application of U.S. patent application Ser. No. 09/375, 881, filed on Aug. 17, 1999, now U.S. Pat. No. 6,261,508 untitled "METHODS AND COMPOSITIONS FOR IONIZING RADIATION SHIELDING" which is a continuation-in-part application of U.S. patent application Ser. No. 08/791,256, filed on Jan. 30, 1997 now abandoned, entitled "METHODS AND COMPOSITIONS FOR IONIZING RADIATION SHIELDING" which is a continuation in part application of U.S. Ser. No. 08/372,289, filed on Jan. 13, 1995, entitled "RADIATION SHIELDING OF INTEGRATED CIRCUITS AND MULTI-CHIP MODULES IN CERAMIC AND METAL PACKAGES", now issued as U.S. Pat. No. 5,635,754 which is a continuation in part application of U.S. Ser. No. 08/221,506, filed on Apr. 1, 1994, entitled "RADIATION SHIELDING OF INTEGRATED CIRCUITS AND MULTI-CHIP MODULES IN CERAMIC AND METAL PACKAGES" now abandoned. This application claims priority to all the foregoing applications and as such the present application hereby claims a priority date of Apr. 1, 1994. This application hereby incorporates by reference all of the above referenced patents and patent applications as if fully set forth herein.

TECHNICAL FIELD

The present invention relates in general to an improved microelectronic device, and a method of making it. The invention more particularly relates to a shielded microelectronic device for withstanding the thermal and radiation hazards found in a spacecraft environment, and which is constructed according to a novel method to be light in weight, structurally and thermally stable, and radiation hardened.

BACKGROUND ART

The use of packaged semiconductor material in an integrated circuit or multi-chip module device for many electronic applications is well known. Such devices enable large scale electronic systems to be substantially reduced in size, thereby permitting the overall size and weight of a device containing such a large scale electronic system to be reduced as well.

This reduction in size and weight is especially important for applications where the size and weight of the device are crucial design parameters, such as in aerospace applications. Many of these devices, representing today's advanced technology integrated circuit devices and multi-chip modules, are developed for commercial computer and other mass market applications, and are available only in plastic or metal packages with low radiation survivability. Unfortunately, these devices are susceptible to electromagnetic interference which can cause the operation of the device to be unreliable.

To prevent electromagnetic interference (EMI) from detracting from the performance of packaged semiconductor devices, EMI shielding has been utilized. For example, reference may be made to the following Japanese patent publications, which are incorporated by reference as if fully set forth herein: Japanese patent publication No. 60-180150, published Sep. 13, 1985; Japanese patent publication No. 2-237053, published Sep. 19, 1990; and Japanese patent publication No. 4-94560, published Mar. 26, 1992.

Two of the foregoing Japanese patent publications, numbers 60-180150 and 4-94560, disclose semiconductor devices enclosed within a plastic package and surrounded by a thin grounded metallic plating to absorb or reflect unwanted EMI. While the shielding of the semiconductor devices described in these Japanese patent publications are capable of preventing malfunctions due to EMI, they cannot adequately shield the semiconductor device from the hazards encountered in a spacecraft environment. The spacecraft environment hazards, including high energy electron, proton, and cosmic ray damage, penetrate the relatively thin protective layer afforded by the EMI shielding, causing the semiconductor device to malfunction in a relatively short time.

Similarly, Japanese patent publication number 2-237053 discloses surrounding the semiconductor device with an EMI wave absorber material in a metal package. The semiconductor device and wave absorber material are contained within a recess in a dielectric material, and further encased within a metal case or package. In this way, radiation of EMI waves outside of the package are substantially reduced. As discussed previously, EMI shielding is not adequate to protect the semiconductor device from the hazards encountered in the spacecraft environment.

Typical silicon integrated circuit plastic packaged devices fail to operate when exposed to total doses of two to fifteen kilorads. The use of ceramic or metal devices, either screened for radiation tolerance or designed for the internal die to meet high radiation levels, have been proposed to protect the semiconductor device from the eventual damaging doses of radiation found in the spacecraft environment. The design and manufacture of such a radiation tolerant die is both expensive and difficult, thus many commercially available integrated circuit and multi-chip modules are not available for radiation tolerant applications. As a result, commercially available packaged silicon integrated circuit devices for use in a spacecraft environment such as low earth orbit, geostationary, or deep space probe, are not feasible. This is especially true for applications like communications satellites, where continuous operation of the application for eight to fifteen years is desired.

Therefore, it would be highly desirable to have a new and improved radiation shielded and packaged silicon integrated circuit device for use in a spacecraft environment. Such a radiation shielded silicon integrated circuit device should be relatively inexpensive to manufacture.

U.S. Pat. No. 4,833,334, which is incorporated by reference as is fully set forth herein, describes the use of a protective box to house sensitive electronic components. This protective box is partially composed of a high atomic weight material to effectively shield against X-rays.

Although the protective box is effective in shielding its contents from harmful X-rays, this approach has the serious disadvantage of adding substantial bulk and weight to electronic circuit assemblies protected in this manner. Moreover, it would be expensive to provide this type of protection to individual integrated circuits as manufacturing custom boxes for each circuit configuration would undoubtedly be costly.

Japanese patent publication number 56-103452, published Aug. 18, 1981, which is incorporated by reference as is fully set forth herein, describes a packaged semiconductor device having external leads connected to an internal semiconductor, wherein the semiconductor is protected from radiation by projections in a base portion of the container body. The projections surround the semiconductor and project up from the base to a height sufficient to block radiation which may penetrate glass feed-throughs. The glass feed-throughs seal the gap between the device and the package leads as they pass through the package body. While the projections aid in protecting the semiconductor from harmful radiation, they also add weight. The additional weight is critical and very undesirable in space applications.

The amount of shielding required to protect a packaged semiconductor device has been reduced by using a method known as spot shielding. An example of spot shielding is disclosed in Japanese patent publication number 62-125651, published Jun. 6, 1987, which is incorporated by reference as is fully set forth herein. Therein, the deterioration of a semiconductor integrated circuit due to radiation is reduced by attaching a double layered shield film to a sealing cover on an upper surface of the semiconductor package and attaching another double layered shield film to a lower surface of the package. The double layered shield film includes an outer light element layer and an inner heavy element layer to prevent incident radioactive rays from invading the package.

Although such a double layered shield film arrangement could be capable of providing some protection for a semiconductor device from radiation, the shielding is not acceptable for some applications. For example, the semiconductor device must be capable of withstanding the enormous forces exerted during acceleration periods. These forces sometimes approach upwards of thirty thousand times the Earth's gravitational pull. Under such an incredible force, the upper shield film is subject to tearing off from the sealing cover. In addition, the upper shield film is in a cantilevered position on the sealing cover. Thus, an edge of the shield film can be pried away from the sealing cover, thereby enabling the shield film to be completely torn away from the sealing cover.

Furthermore, the use of a double layer shield film only slightly reduces the weight of the package. It also increases the size of the package unnecessarily.

In Japanese patent publication No. 62-12561 includes a semiconductor device completely surrounded with a protective material to form an outermost protective layer. A cover shield and a well shield manufactured from another protective material nearly surround the semiconductor to protect it from radiation which penetrates the outermost protective layer.

The amount of shielding required to protect the semiconductor unnecessarily increases the weight and expense of such a semiconductor device.

Japanese patent publication number 61-4249, published Jan. 10, 1986, which is incorporated by reference as is fully set forth herein, describes a spot shielded semiconductor device which utilizes a single layer shield film. This enables the weight of the package to be reduced. In addition, the upper shield film is more securely attached to the package.

Significant disadvantages of the spot shielding method include an increase in the thickness of the device, increased weight of the device, and increased exposure of the semiconductor to side angle radiation due to the shielding being spaced apart from the semiconductor. In addition, a bottom spot shield often cannot be used due to the offset in height which cannot be accommodated by a fixed device lead length. This causes problems when the bottom shield is used on a semiconductor device in conjunction with a printed circuit board in a through hole package style. Furthermore, the spot shielded packaged semiconductor integrated circuit device provides no mechanical support for the spot shields except for the adhesive used to attach it to the surface of the package.

Therefore, it would be highly desirable to have a new and improved radiation shielded and packaged silicon integrated circuit device which protects the integrated circuit device from side angle radiation. Such a radiation shielded silicon integrated circuit device should be light in weight and should be able to withstand the forces encountered during the acceleration of a spacecraft.

DISCLOSURE OF INVENTION

Therefore, the principal object of the present invention is to provide a new and improved radiation shielded and packaged silicon integrated circuit device, and a method of making it, wherein the device is suitable for use in spacecraft environments, and is relatively inexpensive to manufacture. The new and improved device should provide protection from side angle radiation, be light in weight, and should be able to withstand the acceleration forces associated with spacecraft.

Briefly, the above and further objects of the present invention are realized by providing a new and improved radiation shielded and packaged semiconductor device, which can be made according to a novel method of the present invention.

The radiation shielded and packaged semiconductor device includes a lid secured to a base to enclose the integrated circuit die within, wherein the lid and the base are each constructed from a high-Z material to prevent radiation from penetrating therethrough. Another embodiment includes a die attach slug constructed from a high-Z material disposed between the integrated circuit die and a base, in combination with a high-Z material lid to substantially block incident radiation.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein:

FIG. 3A is a cut-away plan view of a prior art ceramic packaged integrated circuit device;

FIG. 4A is a cut-away plan view of a radiation shielded and packaged integrated circuit device, which is constructed in accordance with the present invention;

FIG. 4E is a cut-away plan view of a further radiation shielded and packaged integrated circuit device, which is also constructed in accordance with the present invention;

FIG. 6D is an elevational view of the device of FIG. 6C;

FIG. 9A is a cut-away plan view of another radiation shielded and packaged integrated circuit device, which is also constructed in accordance with the present invention;

BEST MODE FOR CARRYING OUT THE INVENTION

Figure 2A:
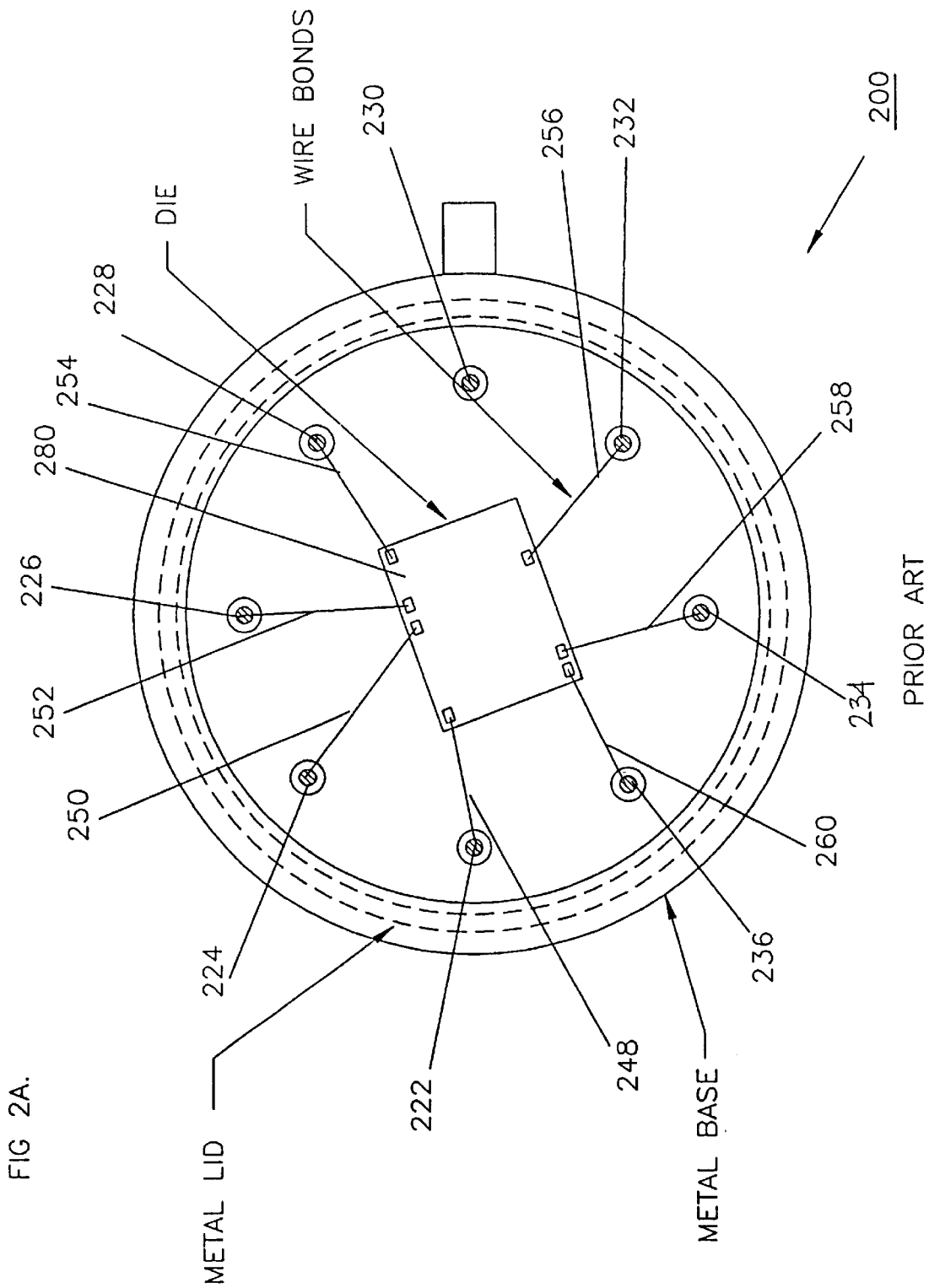
FIG. 2A is a cut-away plan view of a prior art metal packaged integrated circuit device.
Figure 2B:
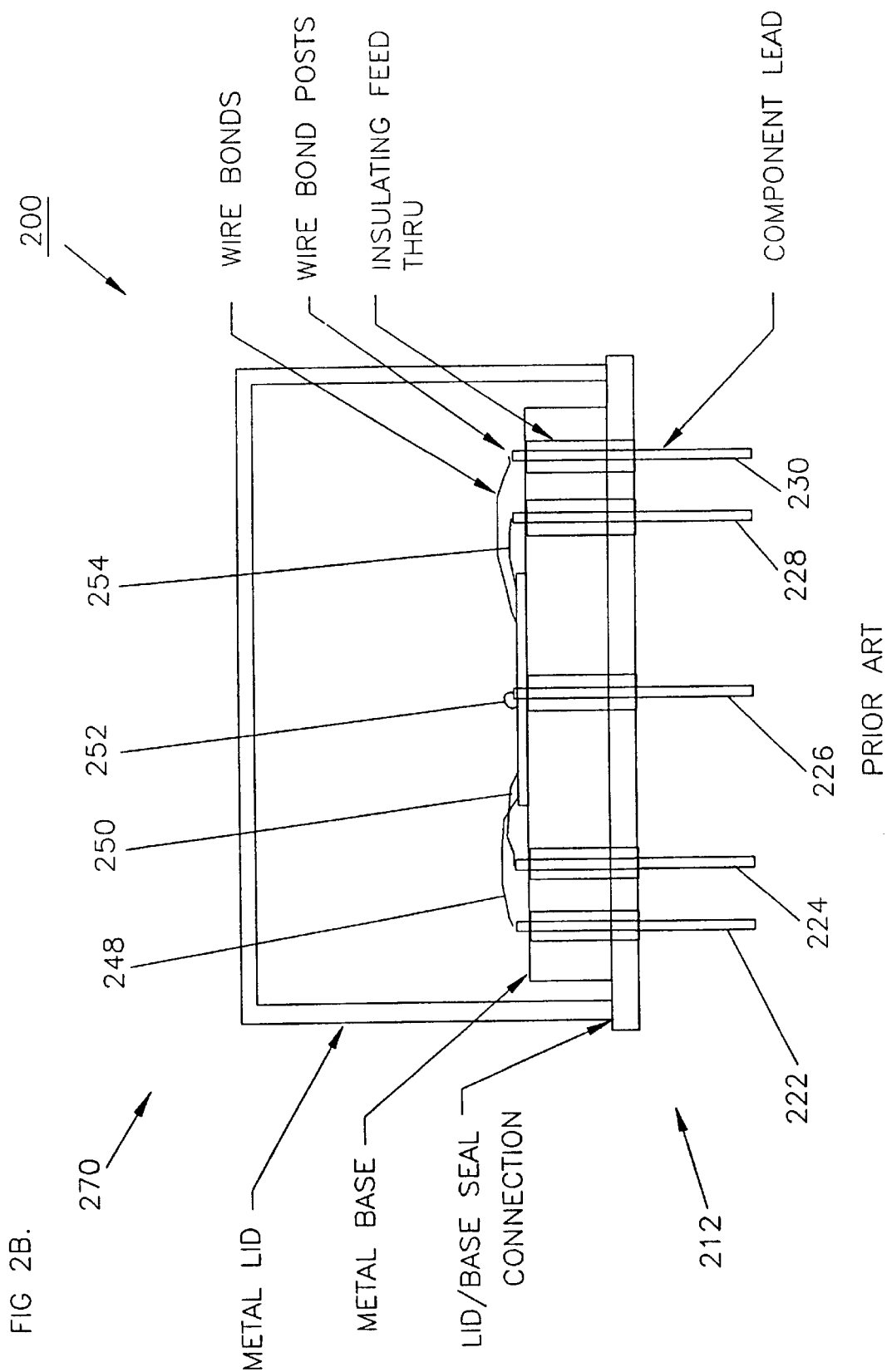
FIG. 2B is an elevational view of the prior art metal packaged integrated circuit device of FIG. 2A.

Referring now to the drawings, and more particularly to FIGS. 2A, 2B, 3A and 3B thereof, there are shown various packaged integrated circuit assemblies 200 and 300, which are known in the art. Assembly 200 (FIGS. 2A, 2B) is representative of a typical metal packaged integrated circuit assembly and consists of a silicon integrated circuit die 280 mounted on a metal base 212 with wire bonds 248, 250, 252, 254, 256, 258 and 260 connecting the die 280 to component leads 222, 224, 226, 228, 230, 232, 234 and 236, respectively. The base 212 is sealed with a metal lid 270, using resistance welding or solder sealing techniques. Although FIGS. 2A and 2B depict a round "pan" type package, e.g., T0–5, T0–99, etc., rectangular packages of similar construction also exist.

Assembly 200 is manufactured using various types of metal to protect the die 280 from hazardous naturally occurring radiation in the atmosphere. The final packaged device 200 is tested for conformance to manufacturer's specifications, and those packages which pass the testing are delivered. Devices such as assembly 200 will not function satisfactorily in the typical space application since the metal housing used is very thin, approximately 3 to 8 mils, and is designed solely for mechanical structure.

Figure 3B:
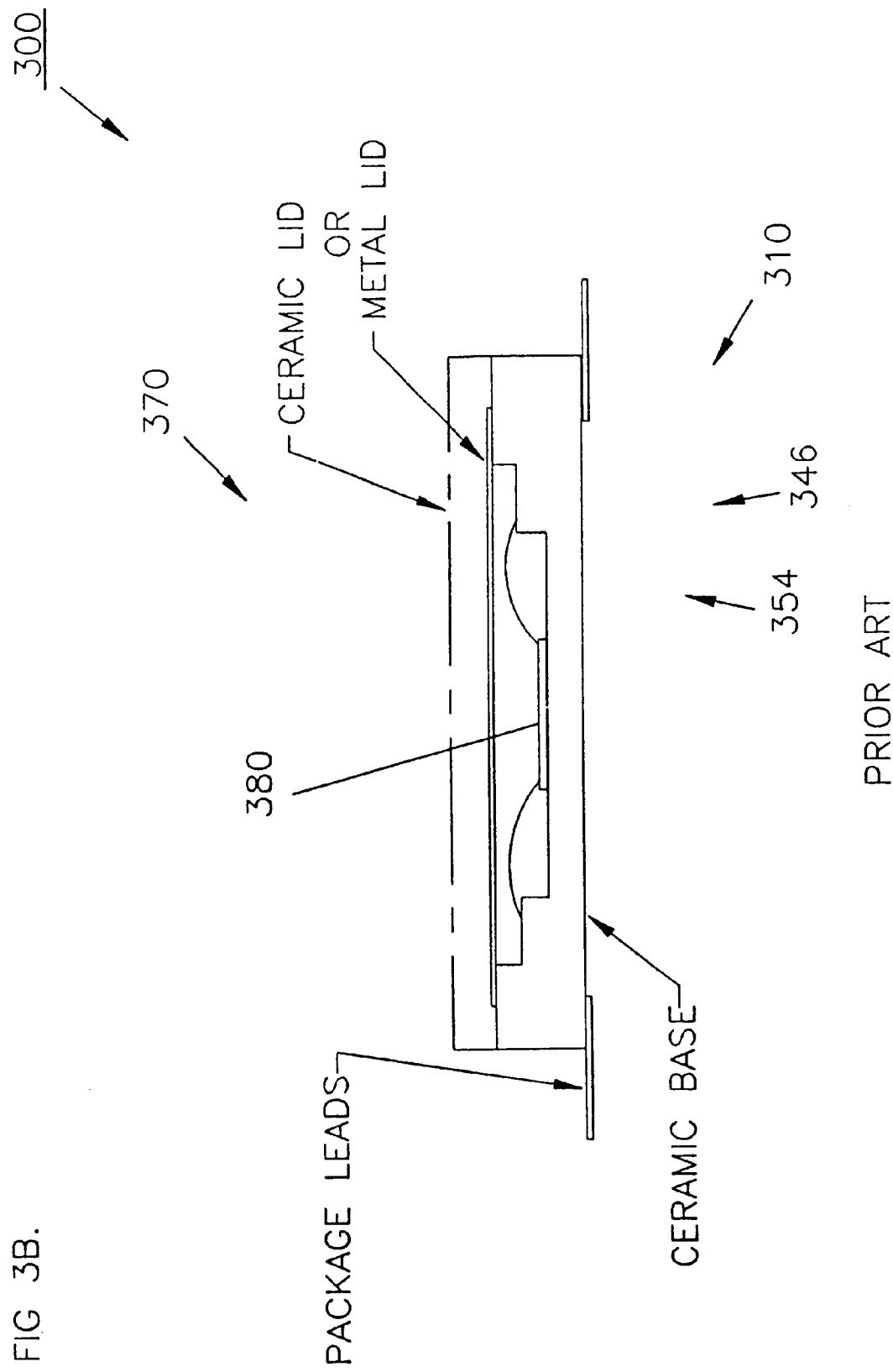
FIG. 3B is an elevational view of the prior art ceramic packaged integrated circuit device of FIG. 3A.

The typical ceramic package integrated circuit assembly 300 of FIGS. 3A and 3B include a silicon integrated circuit die 380 mounted on a ceramic base 310, which could be metallized or unmetallized. Two groups of wirebonds 354 and 356 connect the die 380 to wire bond pads or lead frame 346 and 348. A ceramic or metal, usually Kovar, lid 370 is secured to the base 310 to seal the package assembly 300. Typical ceramic package assemblies, such as package assembly 300, do not use metal on the base, except for heat sinking purposes, and for metallization of the ceramic for wire bond and die attach purposes.

Figure 1A:
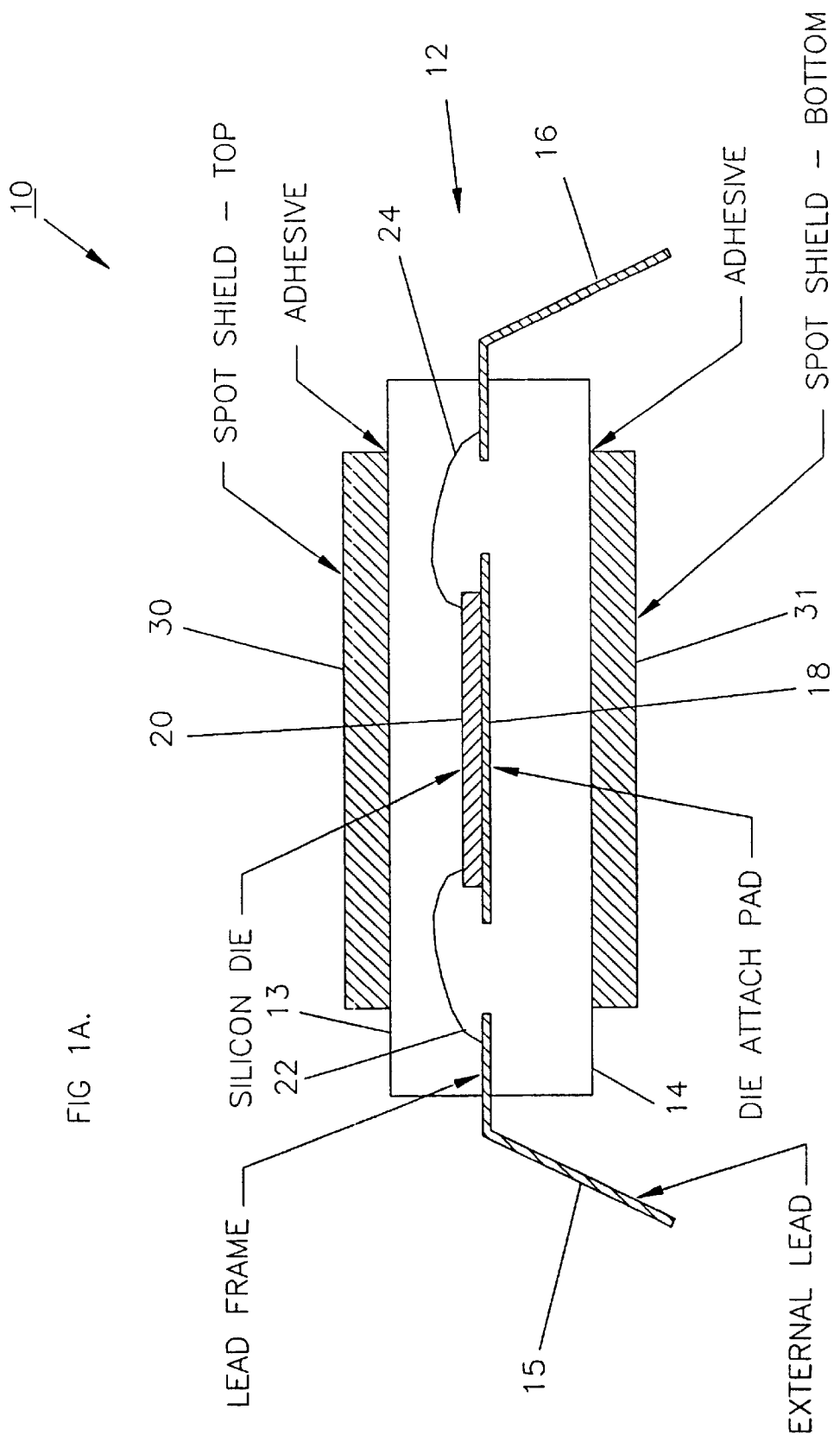
FIG. 1A is an elevational view of a prior art packaged integrated circuit device utilizing spot shielding.
Figure 1B:
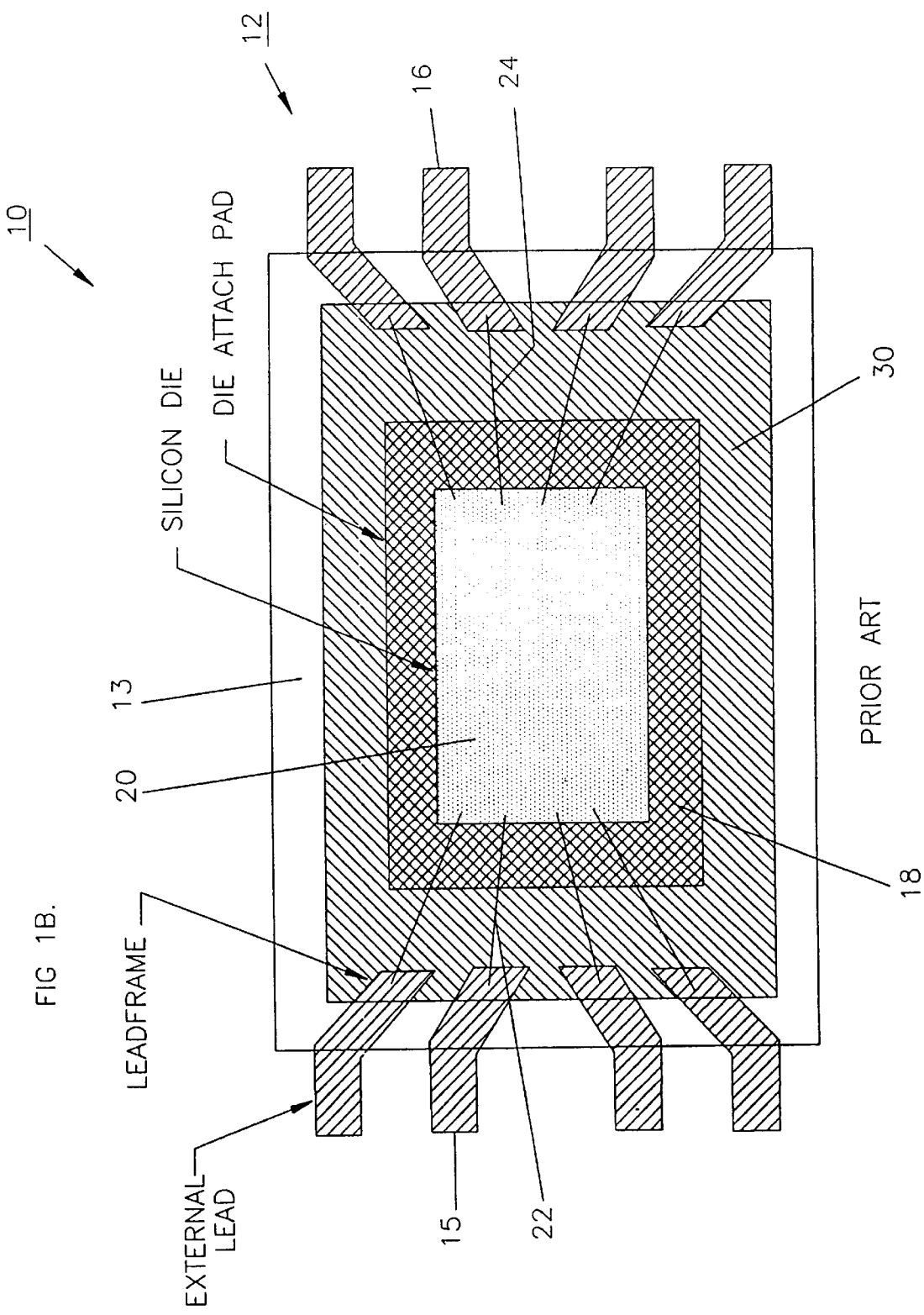
FIG. 1B is a cut-away plan view of the prior art packaged integrated circuit device of FIG. 1A.

Spot shielding was devised to increase the resistance to radiation of atypical metal or ceramic package assembly. An example of a prior art spotshield configuration for a flat package 10 is shown in FIGS. 1A and 1B. The spot shielded package 10 included a body 12 having an upper surface 13 and a lower surface 14, and further included a silicon integrated circuit die 20 mounted to an internal die attach pad 18. The silicon die 20 was electrically connected to external leads, such as leads 15 and 16, by wirebonds, such as wire bonds 22 and 24. Spot shields 30 and 31 were secured to the surfaces 13 and 14, respectively, using an adhesive. Each of the spot shields 30 and 31 were sized and dimensioned to exceed the size of silicon die 20. In this way, incident radiation on the spot shields 30 and 31 would be prevented from striking the silicon die 20. However, no protection was afforded to the silicon die 20 from side angle radiation penetrating the edges of the body 12.

Figure 4B:
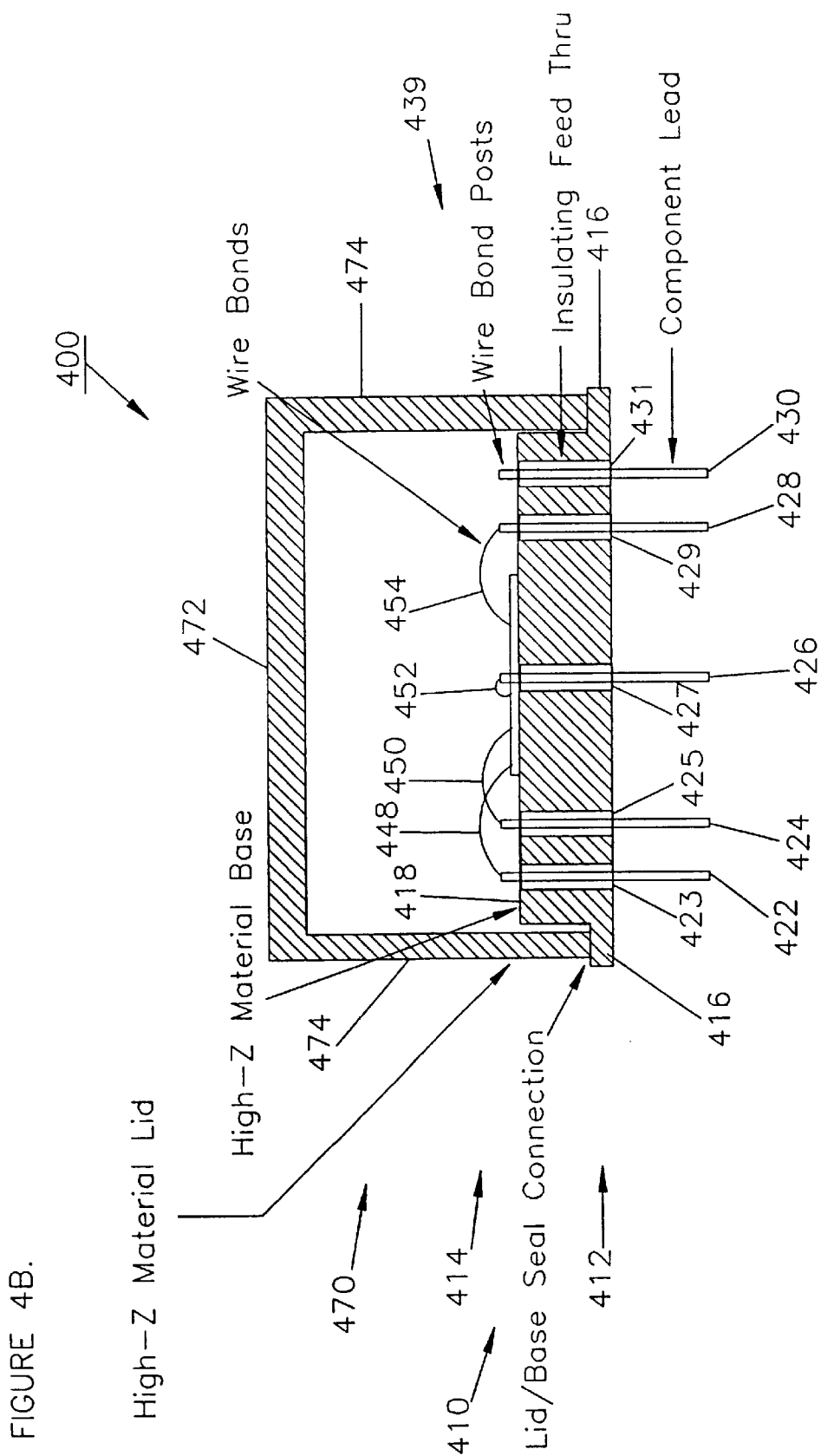
FIG. 4B is an elevational view of the device of FIG. 4A.

Referring now to FIGS. 4A and 4B, there is shown a radiation shielded metal can package 400, which is constructed in accordance with the present invention. The package 400 can be readily manufactured in accordance with the method of the present invention The package 400 generally comprises a base 410 having an upper surface 418, a silicon integrated circuit die 480 secured to the surface 418 by a normal die attach technique, and a lid 470 secured to the base 410 for enclosing the die 480 within. The lid 470 is secured to the base 410 using solder seal techniques, e.g., Au—Sn, or equivalent, epoxy, or resistance welding. Both the base 410 and the lid 470 are constructed from a high-Z material such as a copper-tungsten alloy, or tantalum, or a similar shielding material to reduce the total dose tolerance received at the silicon integrated circuit die 480 to a value less than the integrated circuit total dose tolerance. A procedure for determining the proportions for a preferred shielding composition is described hereinafter in greater detail.

Considering now the construction of the package 400 in greater detail, the base 410 includes a circular upper base portion 414 and a circular lower base portion 412, wherein the lower base portion 412 has a larger diameter than the upper base portion 414. As a result of the larger diameter, the lower base portion 412 extends from the base 410 to form a circular seal connection member 416. The die 480 is connected to component leads 422, 424, 426, 428, 430, 432, 434 and 436 by wire bonds 448, 450, 452, 454, 456, 458 and 460 to enable the die 480 to be connected to external circuitry (not shown). The component leads 422, 424, 426, 428, 430, 432, 434 and 436 pass through the base 410 and are sealed there within by feed-throughs 423, 425, 427, 429, 431, 433, 435 and 437, respectively.

The lid 470 includes a top member 472 having a cylindrical wall member 474 depending from the circular perimeter of top member 472. The inside diameter of wall member 474 is slightly larger than the diameter of the upper base portion 414 to enable the base portion 414 to be received within the lid 470. The inside diameter of the wall member 474 is smaller, however, than the diameter of the lower base portion 412, wherein the connection member 416 abuts the wall member 474 when the upper base 414 is received within the lid 470.

The package 400 is constructed according to a novel method of the present invention, wherein the total dose exposure which the silicon integrated circuit die 480 must survive over a projected useful life is first calculated. Commercially available software is used to model the application environment based on orbit or projectory information according to standard space radiation models, such as NASA's AP-8 or AE-8. The data generated according to the model facilitates the determination of the amount of radiation in a specific orbit for trapped electrons, trapped protons, solar flares and cosmic rays. As a result of the data produced by the modeling, a radiation transport calculation based on the data produced is used to determine the required reduction in total dose radiation which will be received at the integrated circuit die for the specific orbit or mission. This reduction level is required to be less than the integrated circuit die total dose tolerance. The transport calculation is based upon shielding material density, shielding material thickness, the type of material used to stop radiation, the radiation energy level versus dosage for the orbit or mission, and package design.

The base 410 is formed from the high-Z material in a thickness sufficient to shield the silicon integrated circuit die according to the radiation transport calculations. Similarly, the lid 470 is formed from the high-Z material, wherein the thickness of the lid member is also determined by the radiation transport calculations. The integrated circuit die 480 is secured to the base member 410 using normal die attach techniques. The lid 470 is then secured to the base 410 to enclose the integrated circuit die 480 and enable the total dose radiation received at the integrated circuit die 480 to be reduced to a level which is less than the total dose tolerance of the integrated circuit die 480. The lid 470 is secured to the base 410 using a solder seal technique, e.g., Au—Sn or equivalent, epoxy techniques, or by using resistance welding techniques.

The component leads 422, 424, 426, 428, 430, 432, 434 and 436 extend above the surface 418 forming a group of wire bond posts 439. The silicon integrated circuit die 480 is connected to the component leads 422, 424, 426, 428, 430, 432, 434 and 436 through the group of wire bond posts 439.

Figure 4C:
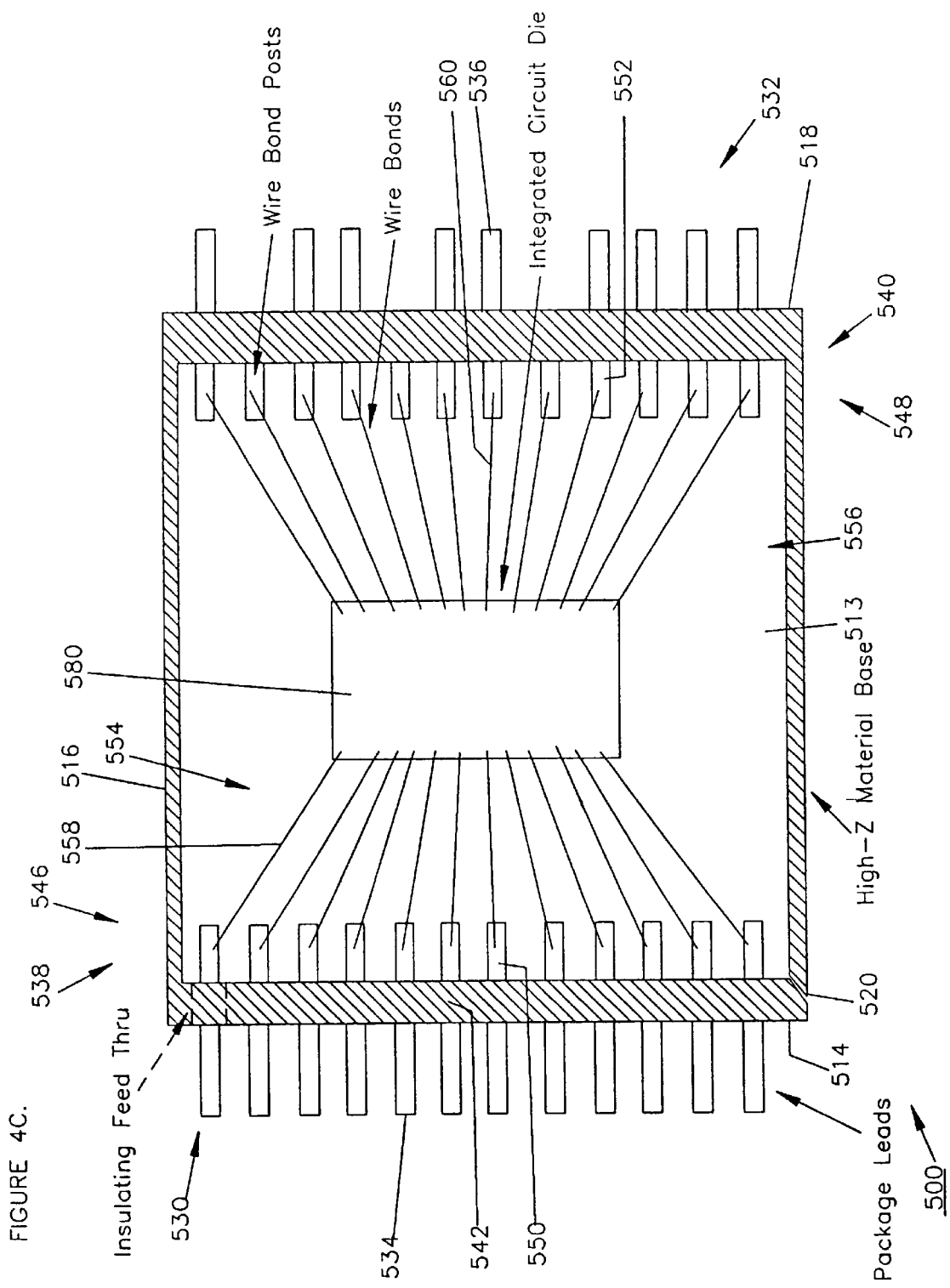
FIG. 4C is a cut-away plan view of another radiation shielded and packaged integrated circuit device, which is also constructed in accordance with the present invention.
Figure 4D:
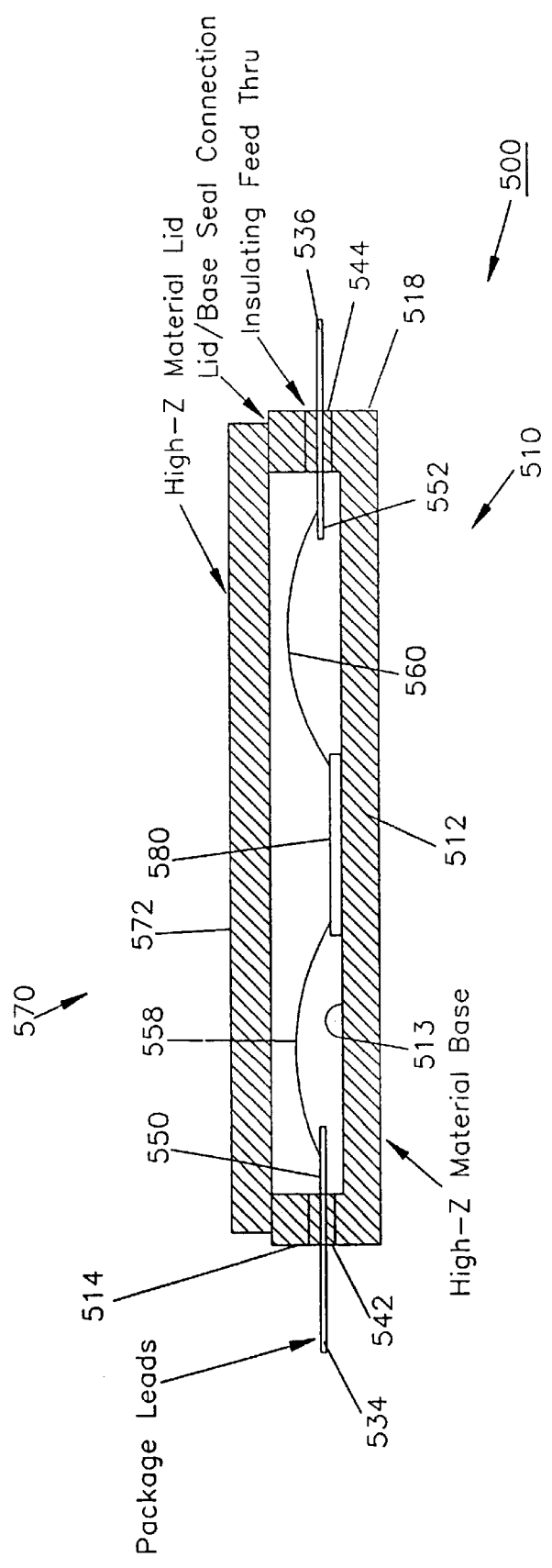
FIG. 4D is an elevational view of the device of FIG. 4C.

Referring now to FIGS. 4C and 4D, there is shown another radiation shielded package 500, which is also constructed according to the present invention. The package 500 is of the metal flat package variety, and includes a silicon integrated circuit die 580 secured to a rectangular base 510. A rectangular lid 570 having a length and width substantially similar to that of the base 510 is secured to the base 510 to enclose and protect the die 580 within The base 510 includes a rectangular bottom member 512 and four side wall members 514, 516, 518 and 520 extending upwardly therefrom. The lid 570 includes a top member 572 sized and dimensioned to engage the side wall members 514, 516, 518 and 520 simultaneously, preferably without extending thereover. Both the base 510 and the lid 570 are constructed from a high-Z material, such as copper-tungsten alloy, or tantalum, or other similar material, to reduce the amount of radiation which can penetrate there through, thereby reducing the total dose radiation received at the die 580 to a level less than the total dose tolerance of the die 580.

A group of package leads 530 penetrates the wall 514 through sealed feed-throughs 538 and terminating within the package 500 at associated wire bond posts 546. Similarly, a group of package leads 532 penetrates side wall member 518 through sealed feed-throughs 540 and terminating within the package 500 at associated wire bond posts 548. Wire bond posts 546 and 548 are electrically connected to the die 580 by wire bond groups 554 and 556 to facilitate the electrical connection of the die 580 to external circuitry (not shown).

The package 500 is constructed in a manner substantially similar to the manner for constructing the package 400, and thus will not be considered hereinafter in greater detail.

Figure 4F:
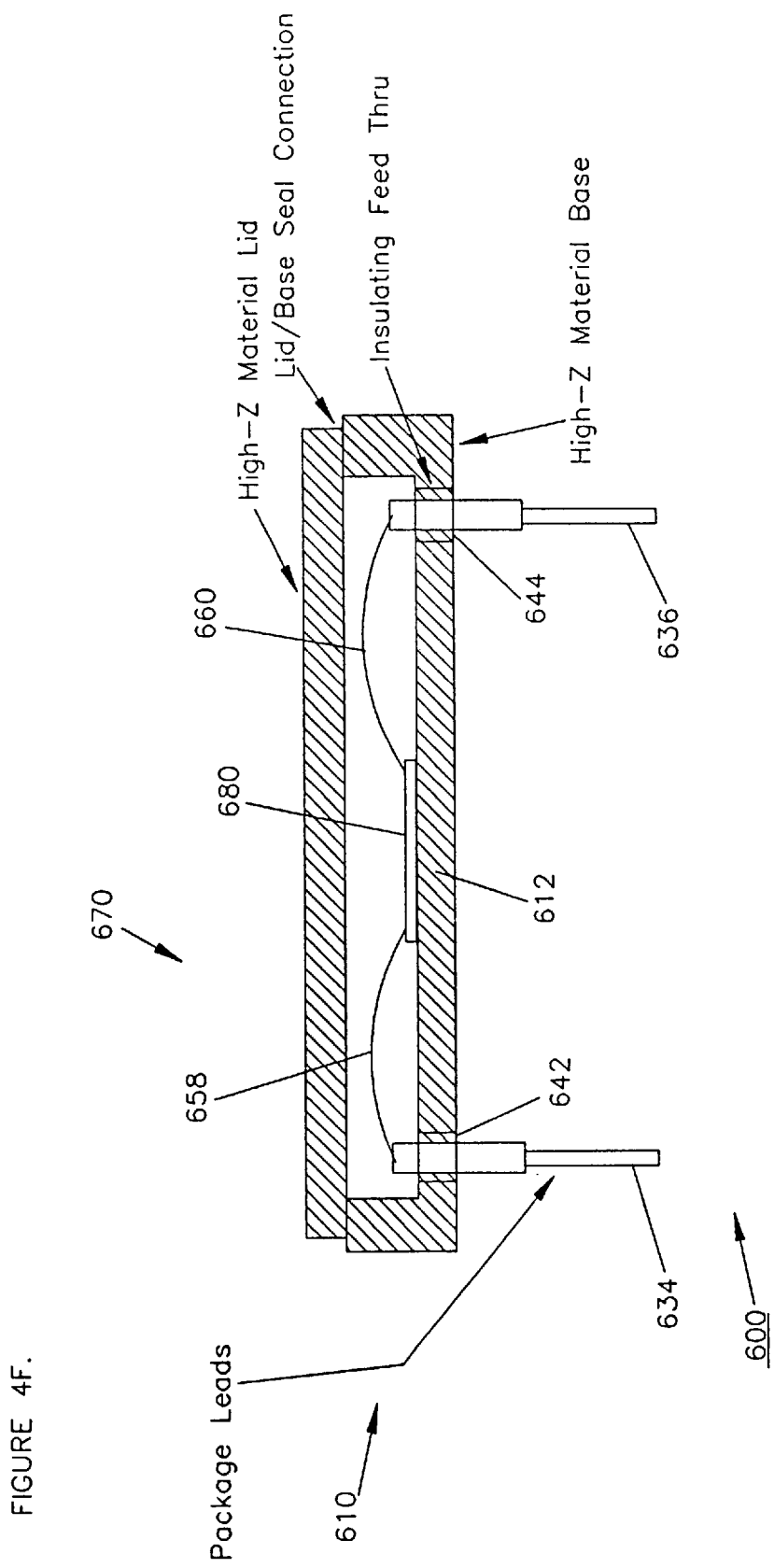
FIG. 4F is an elevational view of the device of FIG. 4E.

Referring now to FIGS. 4E and 4F, there is shown another package 600, which is also constructed according to the present invention. In this regard, the package 600 is illustrative of a metal dual-in-line package.

The package 600 includes a lid 670 and a base 610, both constructed of a high-Z material, such as a copper-tungsten alloy or tantalum, or other similar material, which are secured to one another to shield a silicon integrated circuit die 680 within. The die 680 is secured to a bottom member 612 of the base 610 by normal die attach techniques. The package 600 is substantially similar to the package 500, except that access to external circuitry (not shown) is accomplished by groups of package leads 630 and 632 which penetrate the bottom member 612 on opposite sides of the die 680, rather than through opposite side wall members such as side wall members 514 and 518 of FIGS. 4C and 4D. In this regard, the groups of leads 630 and 632 penetrate the bottom member 612 through associated groups of sealed feed-throughs 638 and 640 to enable access to the external circuitry directly below the base 610. Two groups of wire bonds 639 and 641 connect the die 680 to the groups of leads 630 and 632 to complete the electrical connections there between.

The shielded metal dual-in-line package 600 is constructed according to the novel method of the present invention, as described previously for the packages 400 and 500.

Although the packages 400, 500 and 600 provide substantially 4π coverage for protecting the die 480, 580 and 680, respectively, it may be desirable to utilize less shielding to reduce the weight and cost of the package.

Figure 5A:
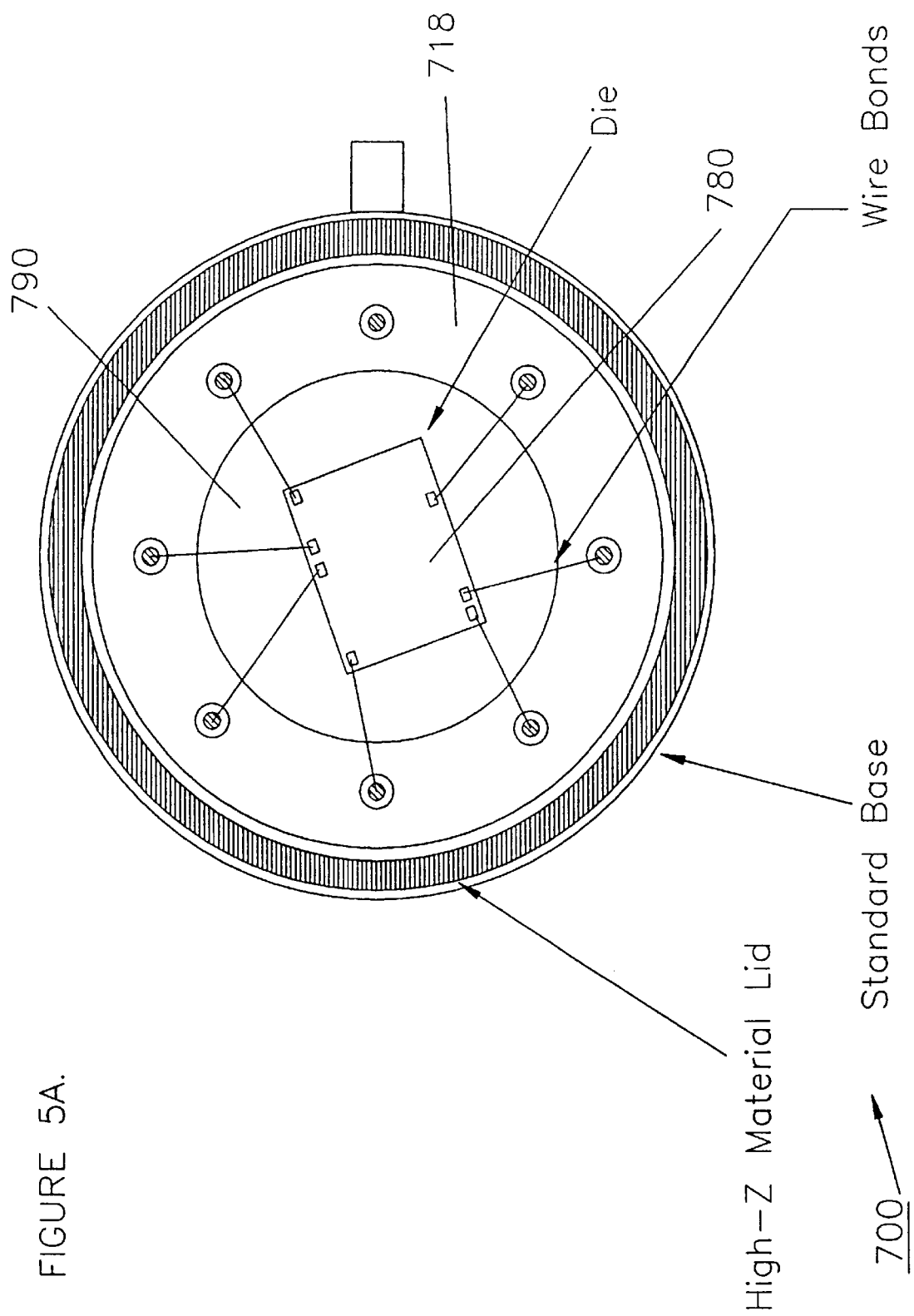
FIG. 5A is a cut-away plan view of another radiation shielded and packaged integrated circuit device, which is also constructed in accordance with the present invention.
Figure 5B:
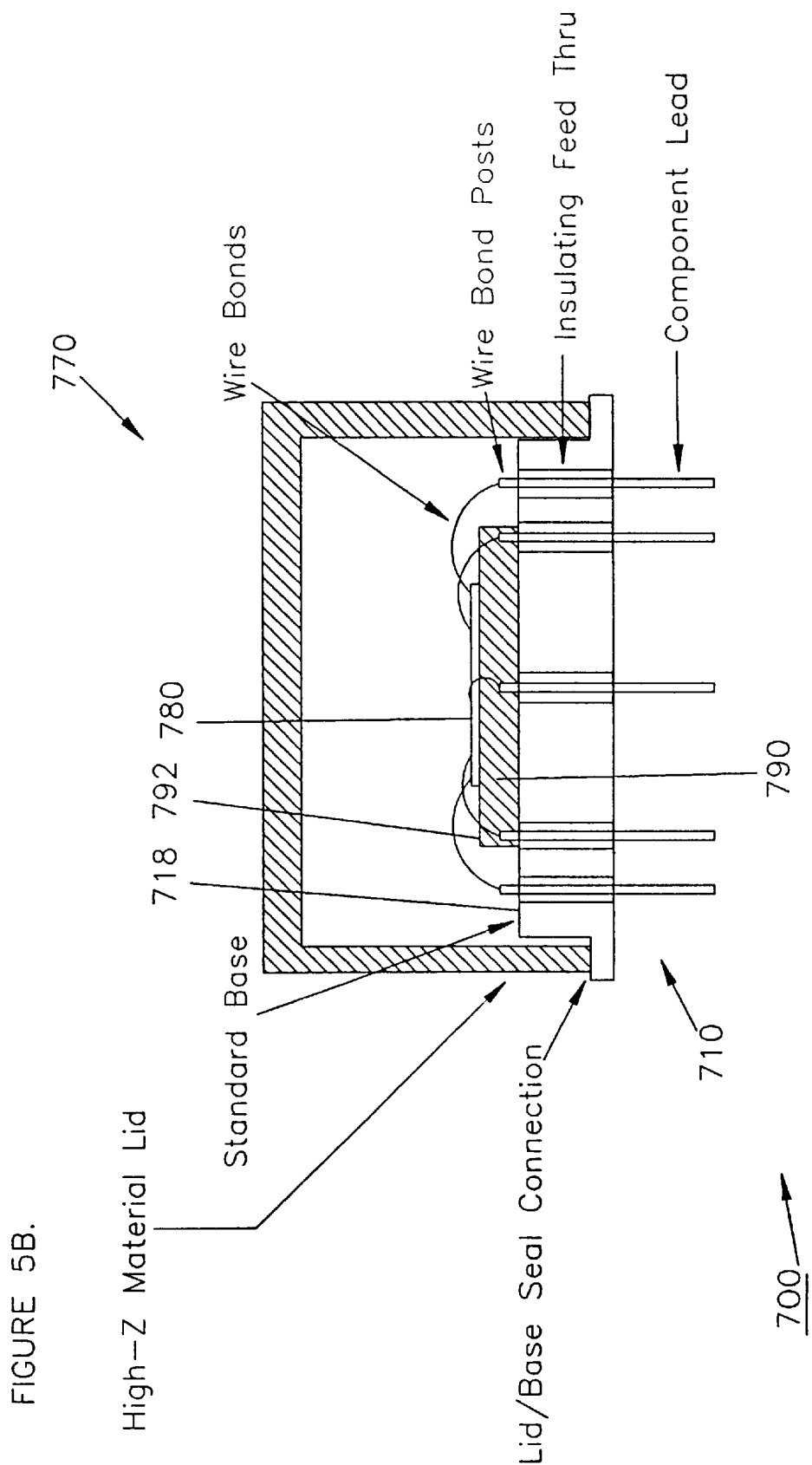
FIG. 5B is an elevational view of the device of FIG. 5A.

Referring now to FIGS. 5A and 5B, there is shown a further radiation shielded package 700 which is constructed in accordance with the present invention, which provides nearly 4π coverage, and which utilizes less high-Z material to reduce the cost and weight of the package 700.

The package 700 includes a base 710 secured to a lid 770 to enclose a silicon integrated circuit die 780 within. The lid 770 is substantially similar to the lid 470 (FIG. 4B), and will not be described hereinafter in greater detail. Unlike the base 410 (FIG. 4B), the base 710 is constructed from a standard base material, e.g., metal, metallized or ceramic. A die attach slug 790 constructed from a high-Z material, such as copper-tungsten or tantalum, or similar material, is secured to an upper surface 718 of the base 710 to protect the die 780 from incident radiation. In this regard, the die 780 is secured to a die attach slug surface 792, thereby positioning the die 780 between the lid 770 and the die attach slug 790 to provide nearly 4π coverage. The die attach slug 790 is secured to the base 710 by using silver glass for metal, metallized or ceramic bases, epoxy for metal, metallized or ceramic bases, resistance welding for metal or metallized bases, or a eutectic technique, e.g., Au—Sn, Au—Si or equivalent, for metal or metallized bases. The die 780 is secured to the surface 792 using normal die attach techniques.

Figure 5C:
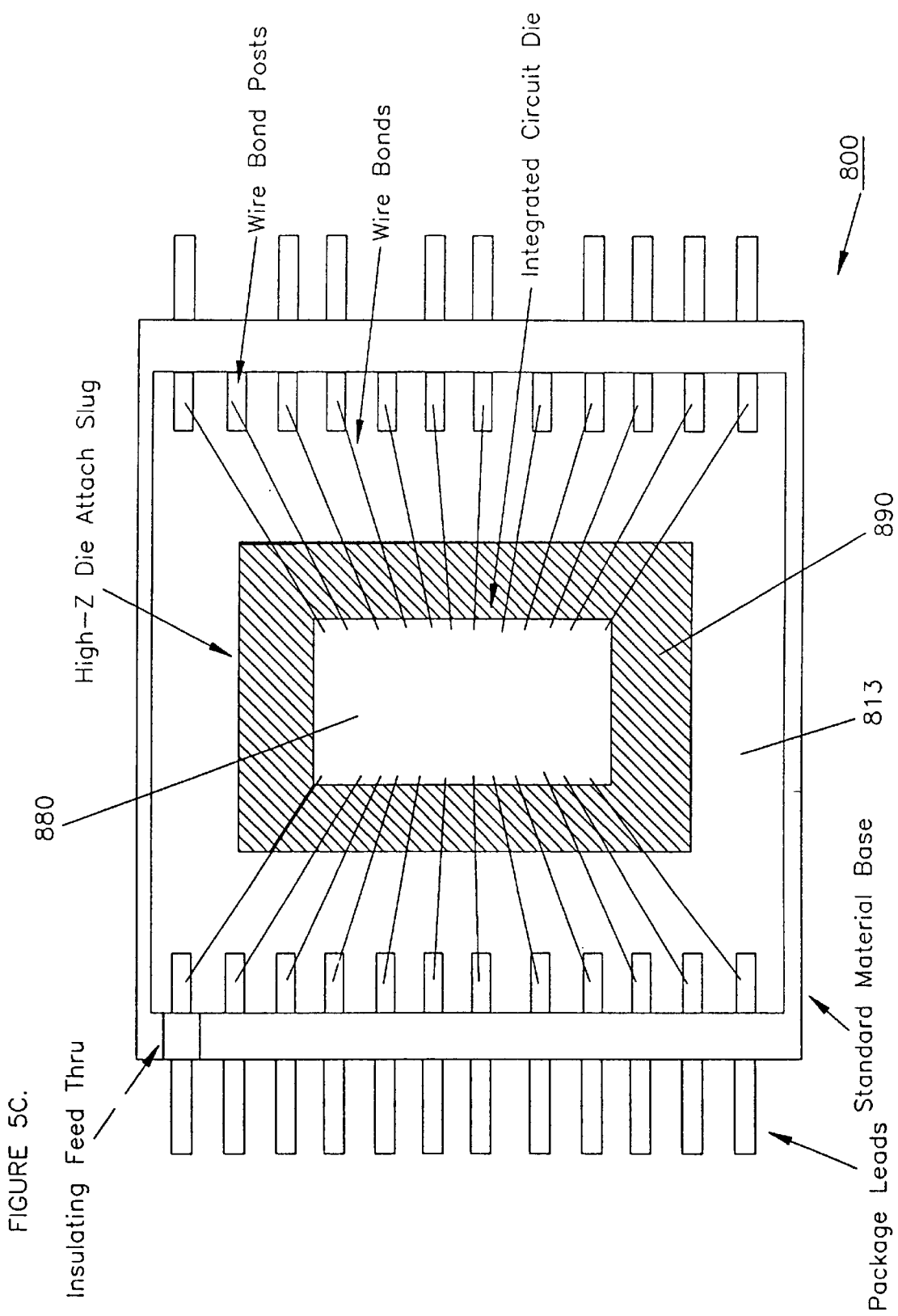
FIG. 5C is a cut-away plan view of yet another radiation shielded and packaged integrated circuit device, which is also constructed in accordance with the present invention.
Figure 5D:
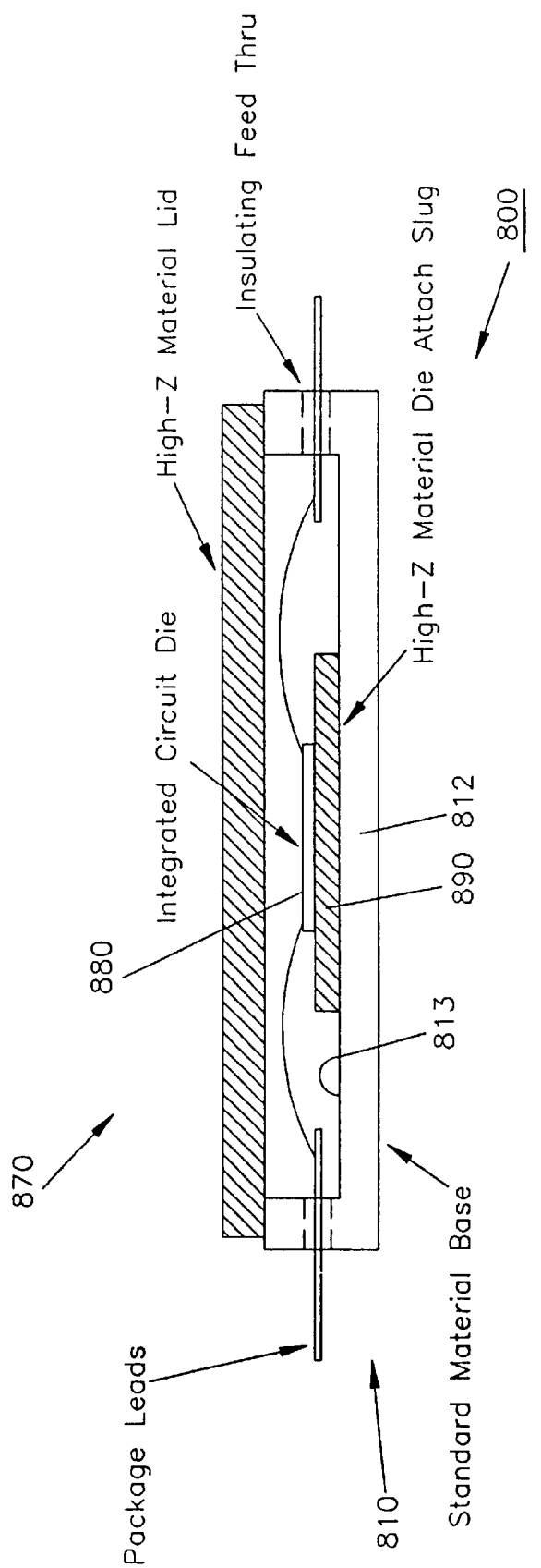
FIG. 5D is an elevational view of the device of FIG. 5C.

Referring now to FIGS. 5C and 5D, there is shown another radiation shielded package 800, which is also constructed according to the present invention. The package 800 includes a lid 870 secured to a base 810 to enclose a silicon integrated circuit die 880 within.

The lid 870 is substantially similar to the lid 570 (FIGS. 4C and 4D), and will not be described hereinafter in further detail. However, unlike the base 410 of FIGS. 4C and 4D, the base 810 is constructed from a standard base material such as a metal, metallized or ceramic base. A die attach slug 890 is secured to an inner surface 813 using silver glass for metal, metallized or ceramic bases, epoxy for metal, metallized or ceramic bases, resistance welding for metallized bases, or eutectic techniques for metal or metallized bases.

The die attach slug 890 is constructed from a high-Z material and is sized and dimensioned to be larger than the size of the die 880. When the lid 870 is secured to the base 810, the die 880 has nearly 4π protection, meaning that protection is afforded from all directions.

Figure 5E:
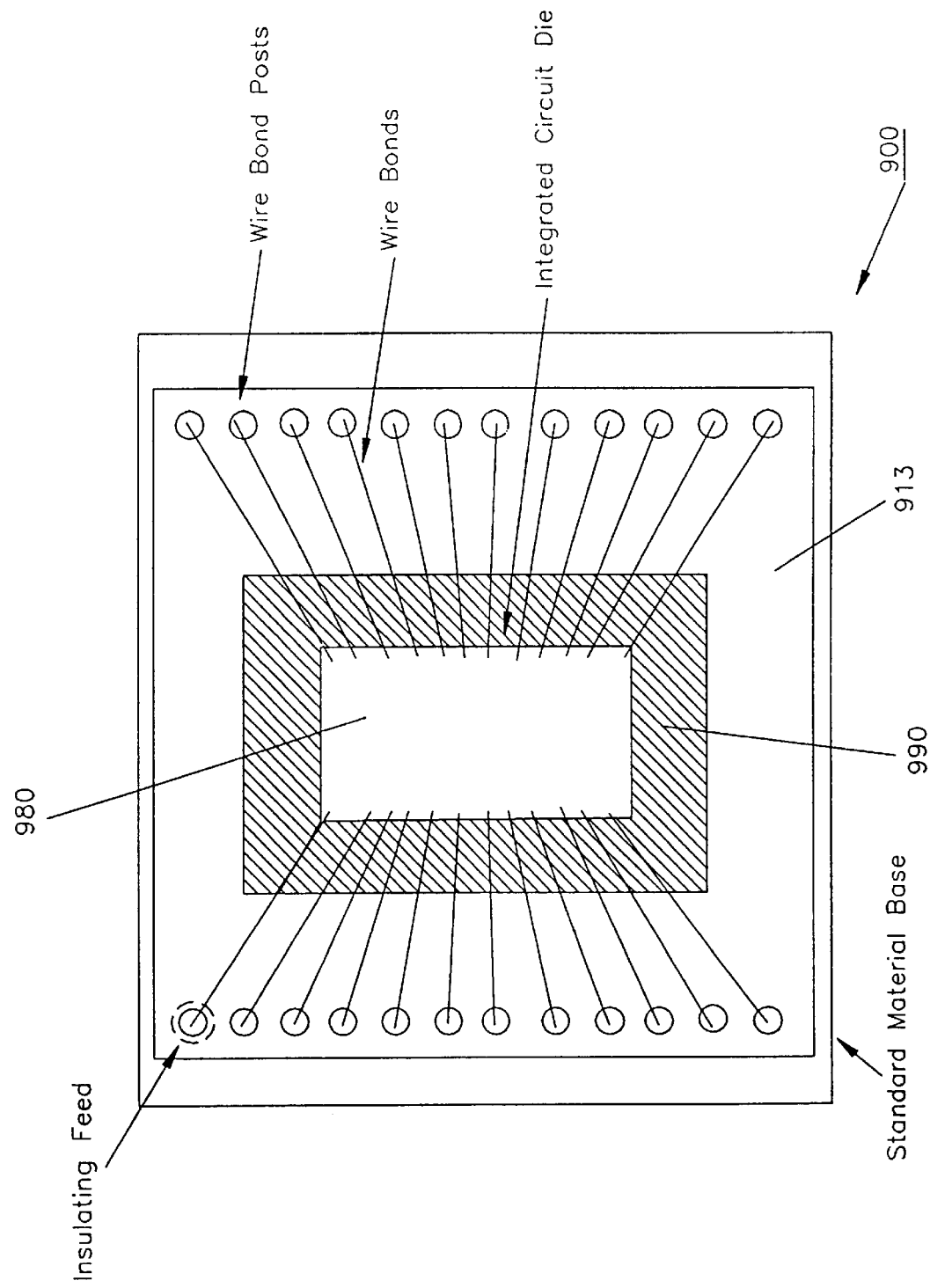
FIG. 5E is a cut-away plan view of a further radiation shielded and packaged integrated circuit device, which is also constructed in accordance with the present invention.
Figure 5F:
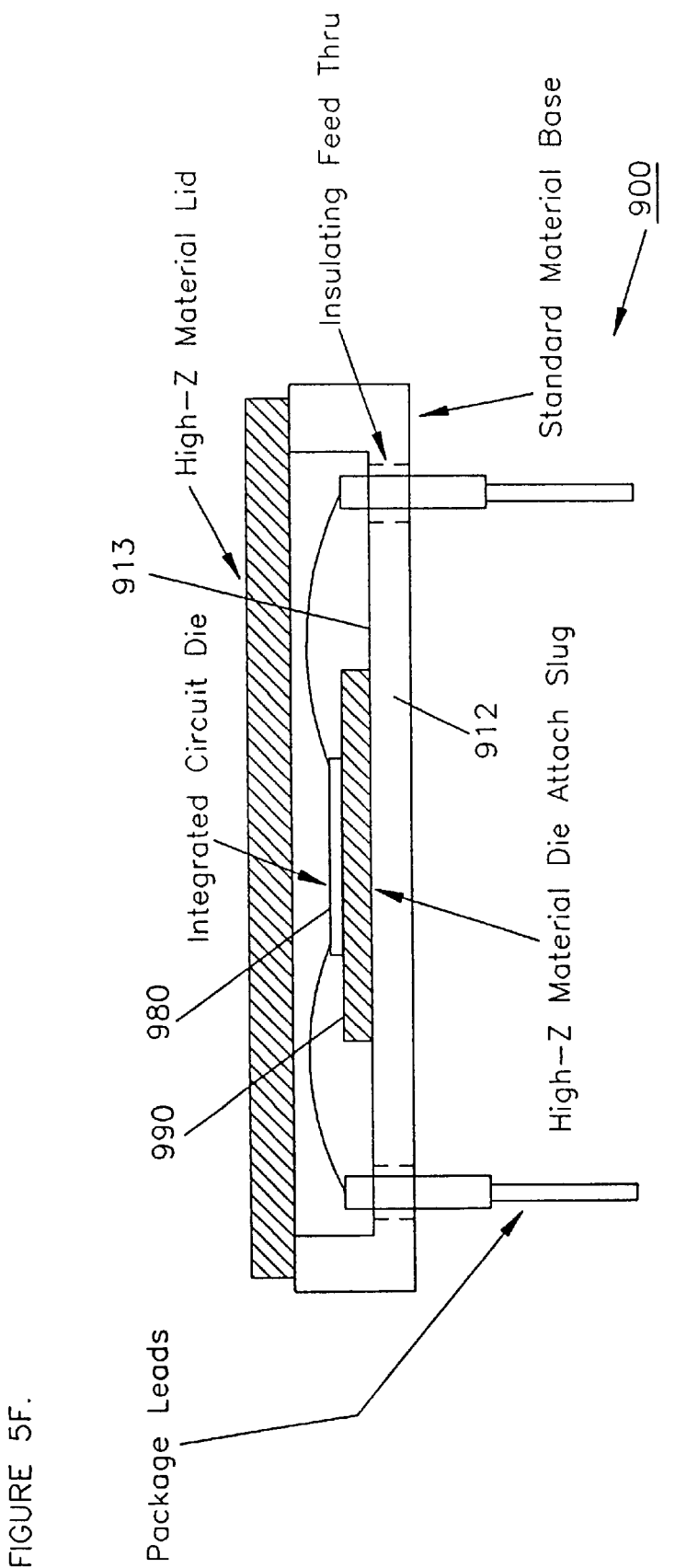
FIG. 5F is an elevational view of the device of FIG. 5E.

Referring now to FIGS. 5E and 5F, there is shown another radiation shielded package 900, which is also constructed according to the present invention. The package 900 is substantially similar to the package 600 of FIGS. 4E and 4F. The package 900 utilizes a high-Z die attach slug 990 secured to a surface 913 of the base 910, wherein the base 910 is constructed of a standard base material. In this way, the amount of high-Z material is reduced, thereby reducing the weight and expense of the package 900, yet still providing nearly 4π coverage.

Additional embodiments of the present invention are illustrated in FIGS. 6A, 6B, 6C and 6D, wherein radiation shielded packages 1000 and 1100 are shown. The packages 1000 and 1100 are substantially similar to the packages 700 and 800 of FIGS. 5A, 5B, 5C and 5D. In this regard, packages 1100 utilize a standard material base 1010 and 1110 in conjunction with high-Z lids 1070 and 1170. However, unlike the packages 700 and 800, the packages 1000 and 1100 utilize bottom shields 1095 and 1195 secured to an outer surface of the bases 1010 and 1110.

Figure 7A:
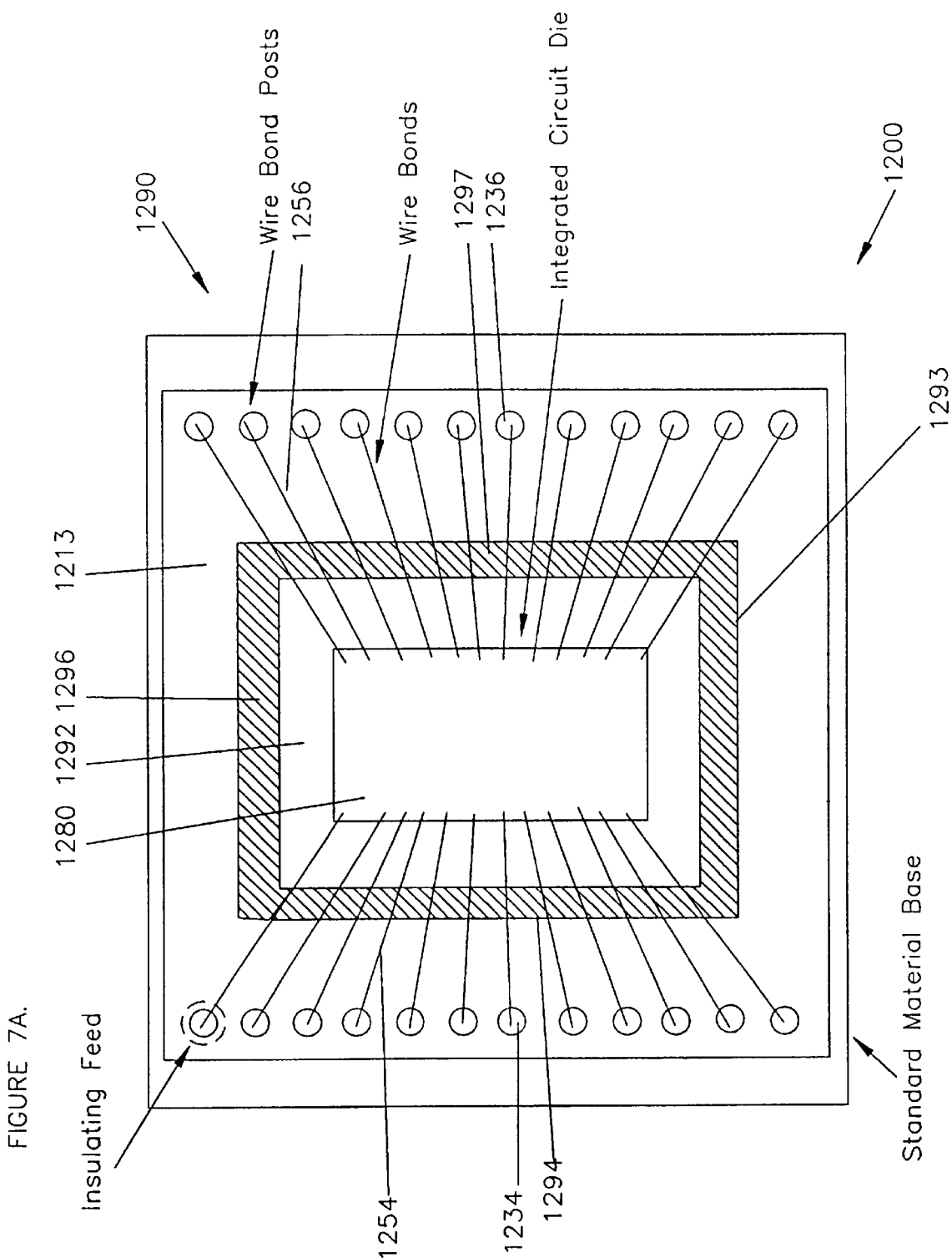
FIG. 7A is a cut-away plan view of a further radiation shielded and packaged integrated circuit device, which is also constructed in accordance with the present invention.
Figure 7B:
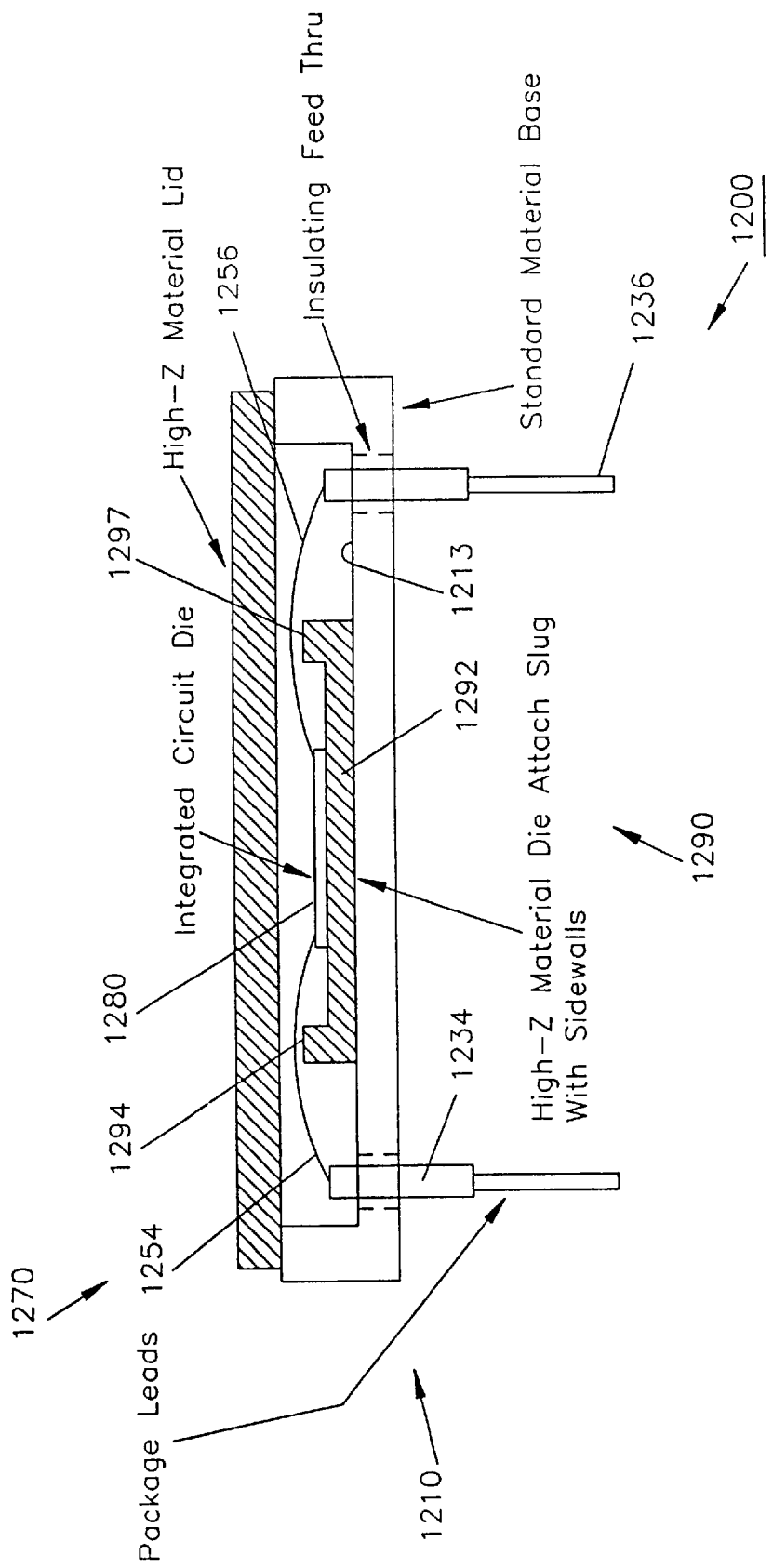
FIG. 7B is an elevational view of the device of FIG. 7A.

Referring now to FIGS. 7A and 7B, there is shown another radiation shielded package 1200 which is also constructed according to the present invention. The package 1200 is substantially similar to the package 900 of FIGS. 5E and 5F, except that the die attach slug 1290 has been modified to provide additional protection from side angle radiation. In this regard, the die attach slug 1290 includes a bottom member 1292 and side wall members 1293, 1294, 1296 and 1297, secured to the perimeter of the bottom member 1292. The additional side wall members 1293, 1294, 1296 and 1297 provide additional protection from side angle radiation. The height of the side wall members 1293, 1294, 1296 and 1297 can be adjusted to substantially reduce the incidence of side angle radiation on the die 1280.

Figure 6A:
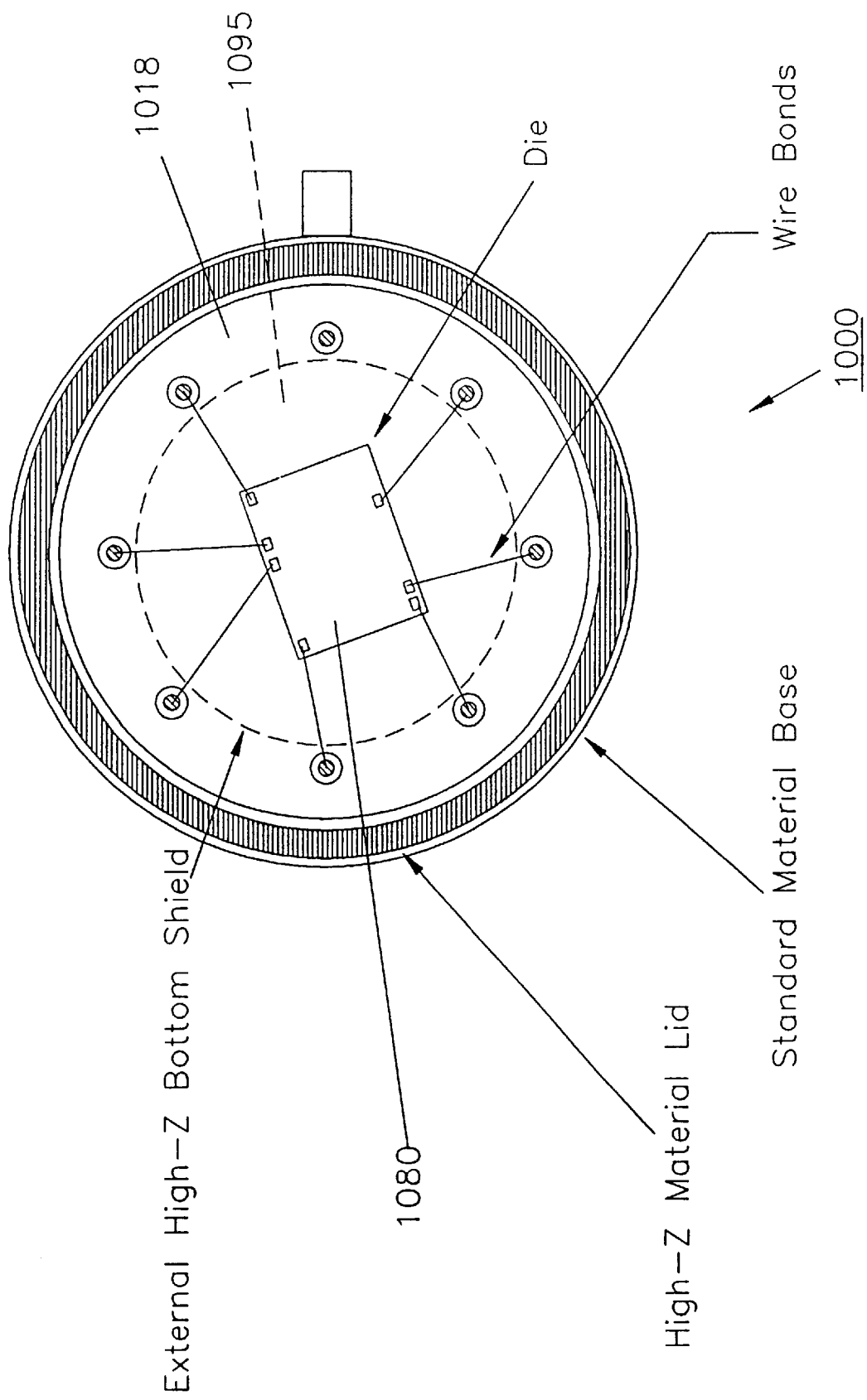
FIG. 6A is a cut-away plan view of another radiation shielded and packaged integrated circuit device, which is also constructed in accordance with the present invention.
Figure 6B:
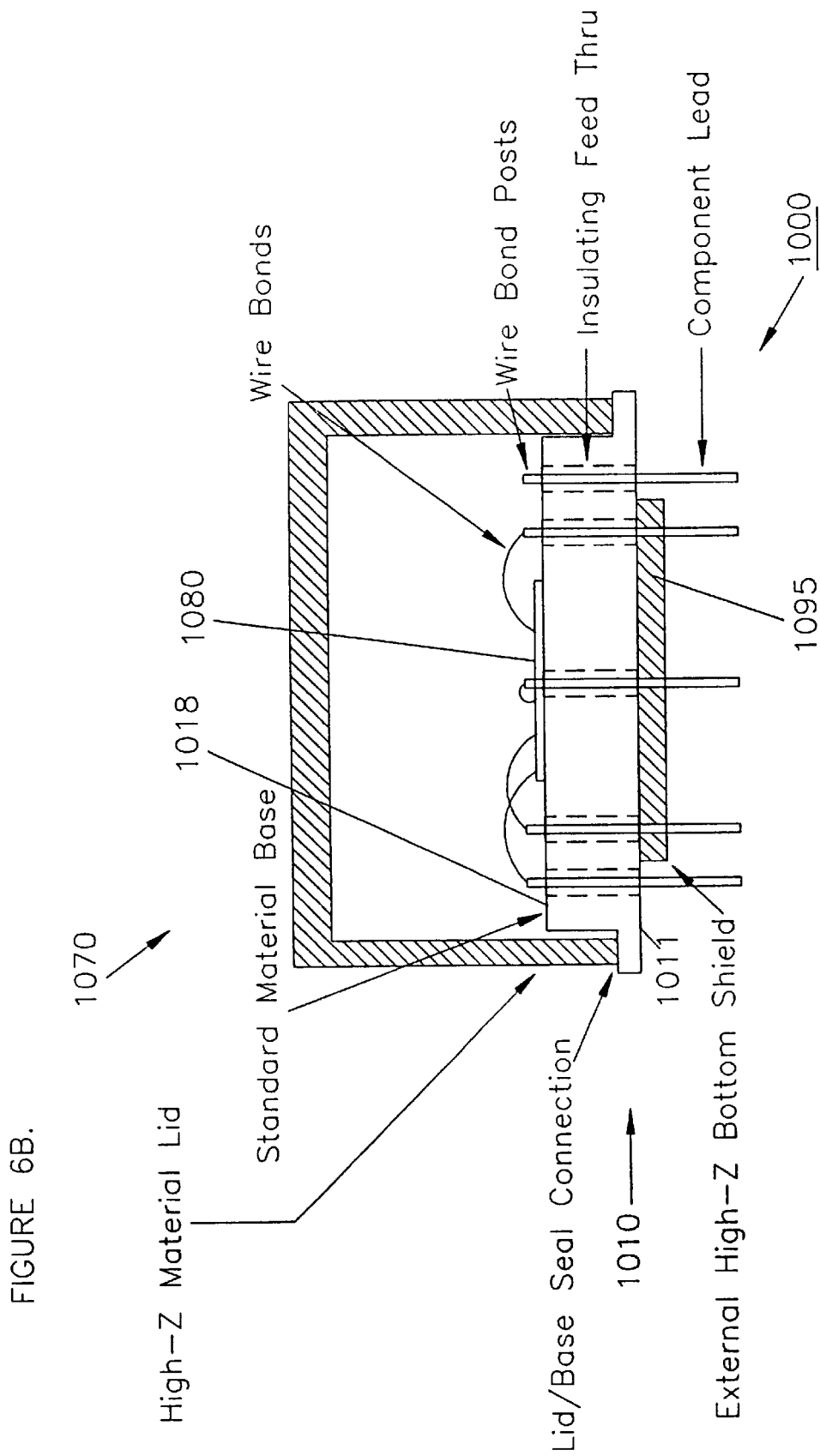
FIG. 6B is an elevational view of the device of FIG. 6A.
Figure 6C:
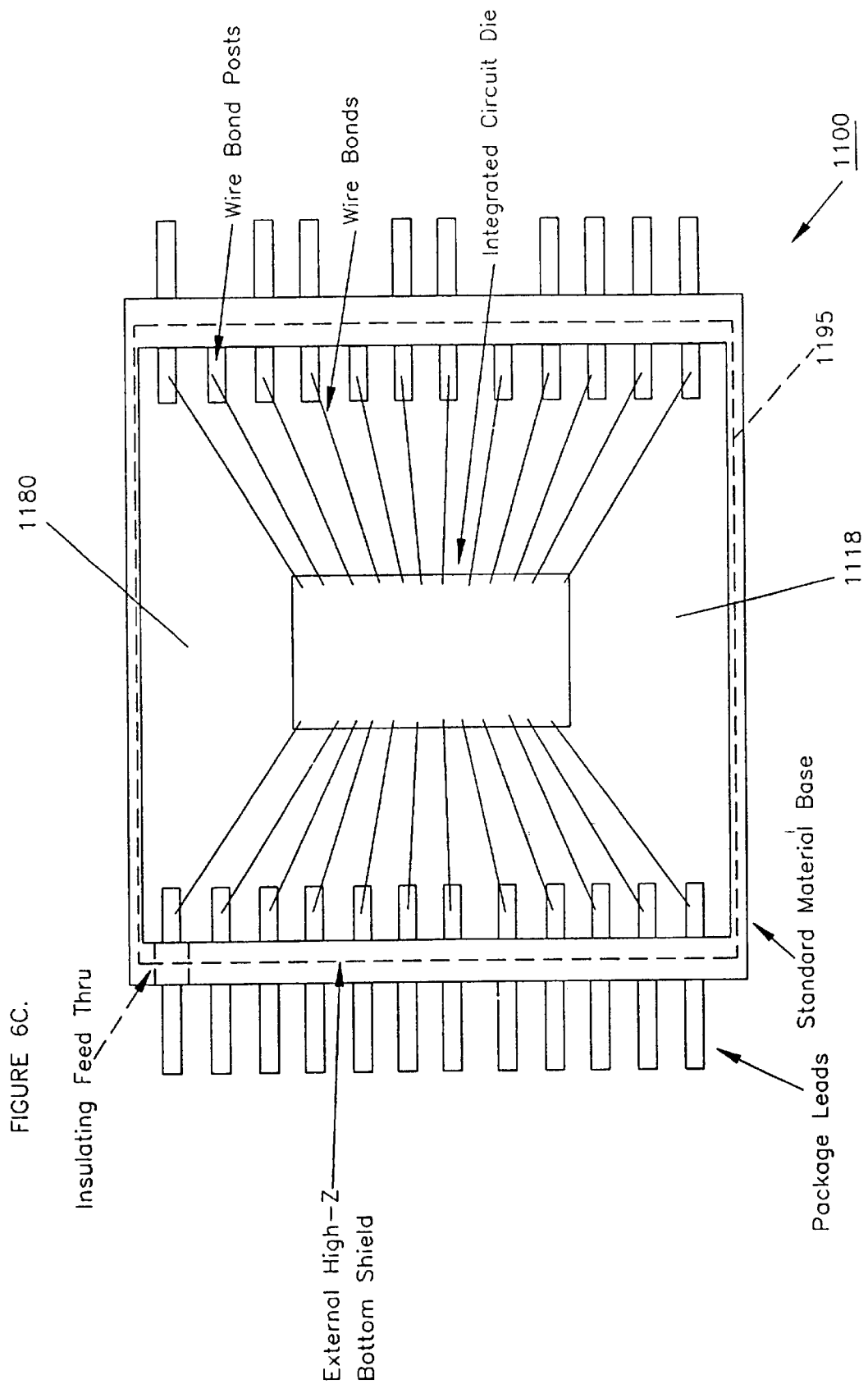
FIG. 6C is a cut-away plan view of yet another radiation shielded and packaged integrated circuit device, which is also constructed in accordance with the present invention.
Figure 7C:
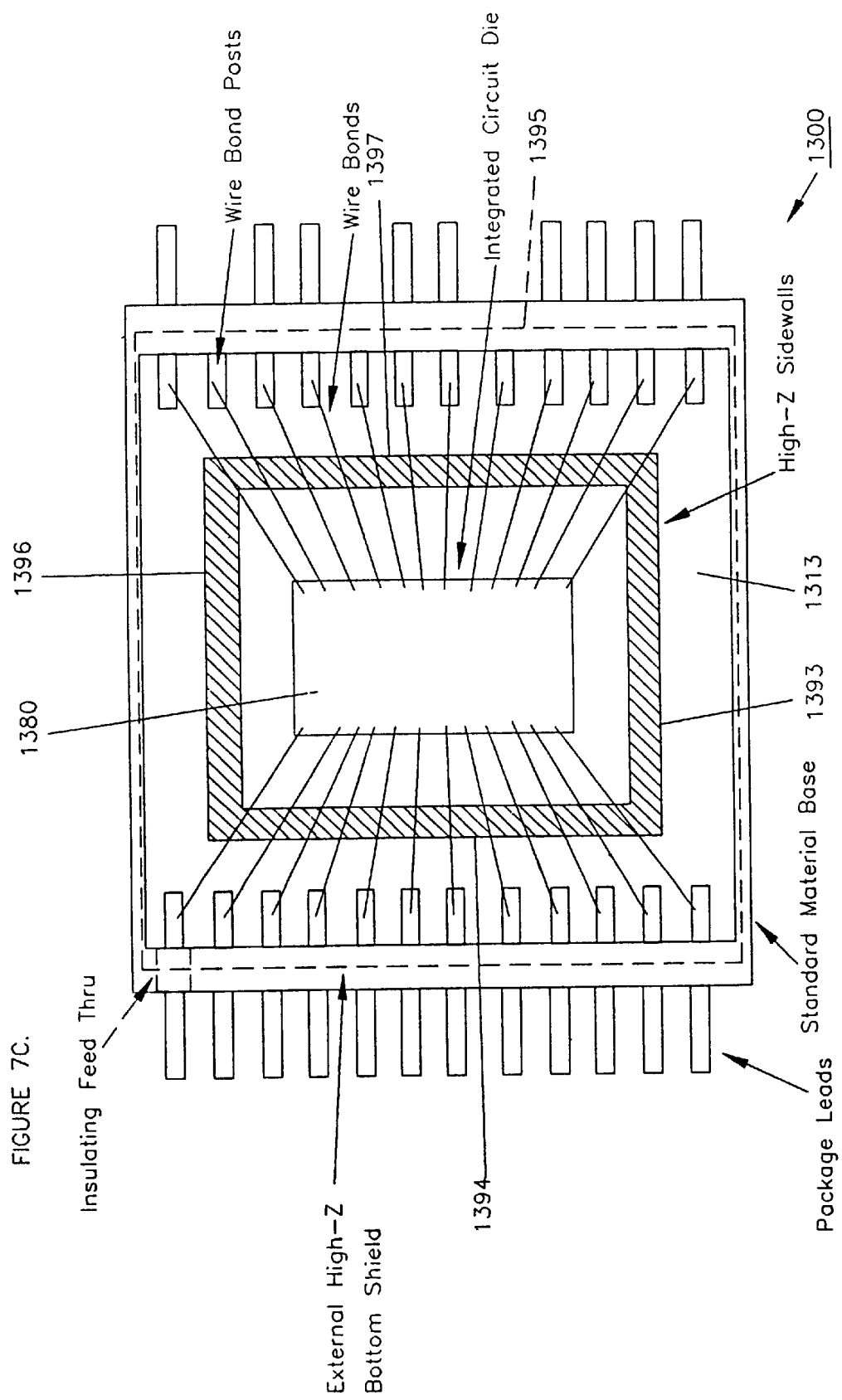
FIG. 7C is a cutaway plan view of yet another radiation shielded and packaged integrated circuit device, which is also constructed in accordance with the present invention.
Figure 7D:
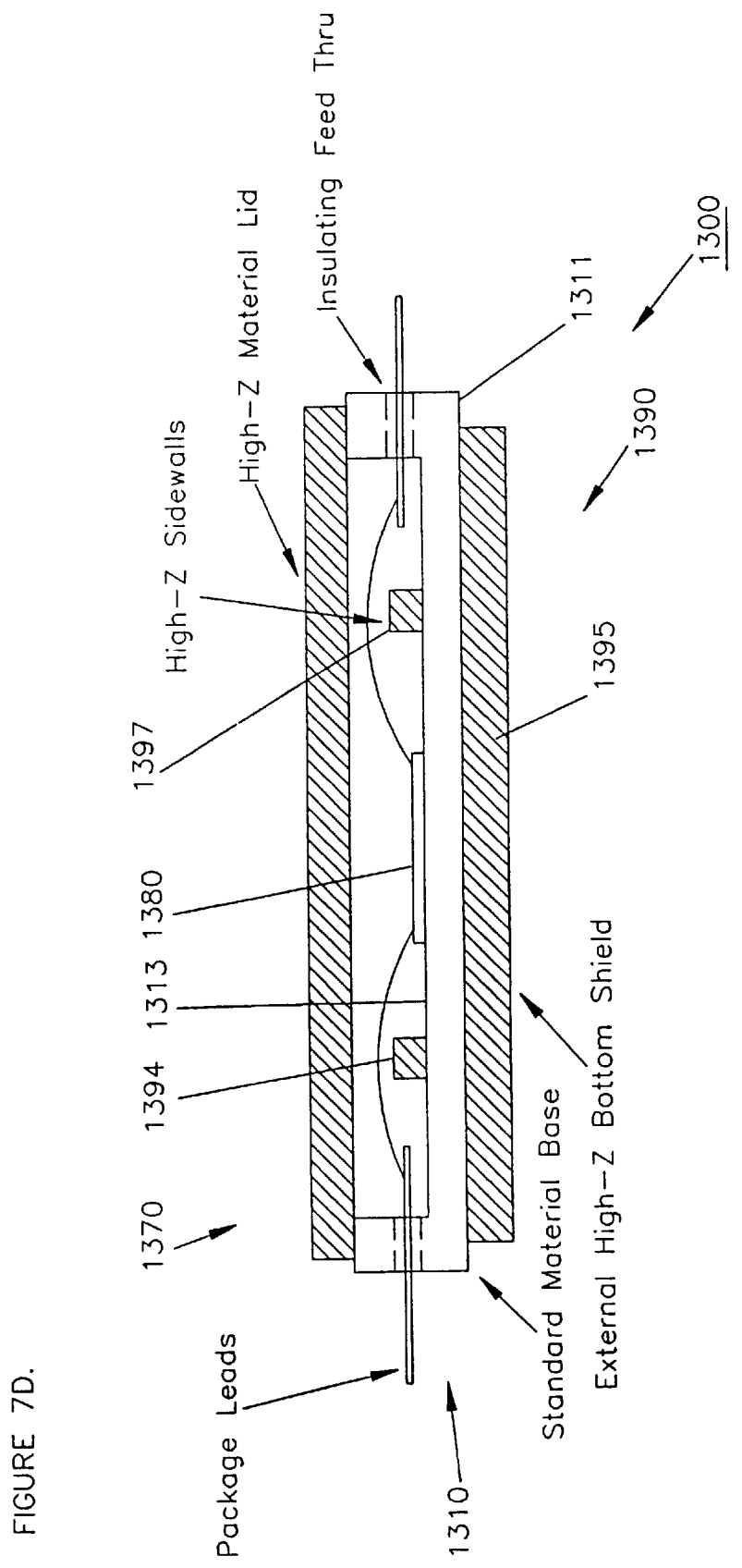
FIG. 7D is an elevational view of the device of FIG. 7C.

Wire bonds, such as wire bonds 1254 and 1256, connect electrically the die 1280 to leads, such as leads 1234 and 1236. Wire bonds 1254 and 1256 maybe insulated where required due to wire thickness and operating conditions Referring now to FIGS. 7C and 7D, there is shown a radiation shielded package 1300, which is also constructed according to the present invention. The package 1300 is substantially similar to the package 1100 (FIGS. 6C and 6D). The package 1300, however, provides additional protection from side angle radiation over that provided by the package 1100 by the inclusion of interior side wall members 1393, 1394, 1396 and 1397. The side wall members 1393, 1394, 1396 and 1397 are contiguous with one another and are secured to an inner surface 1313 of base 1310. The side wall members 1393, 1394, 1396 and 1397 are constructed from a high-Z material to provide additional protection from side angle radiation.

Figure 7E:
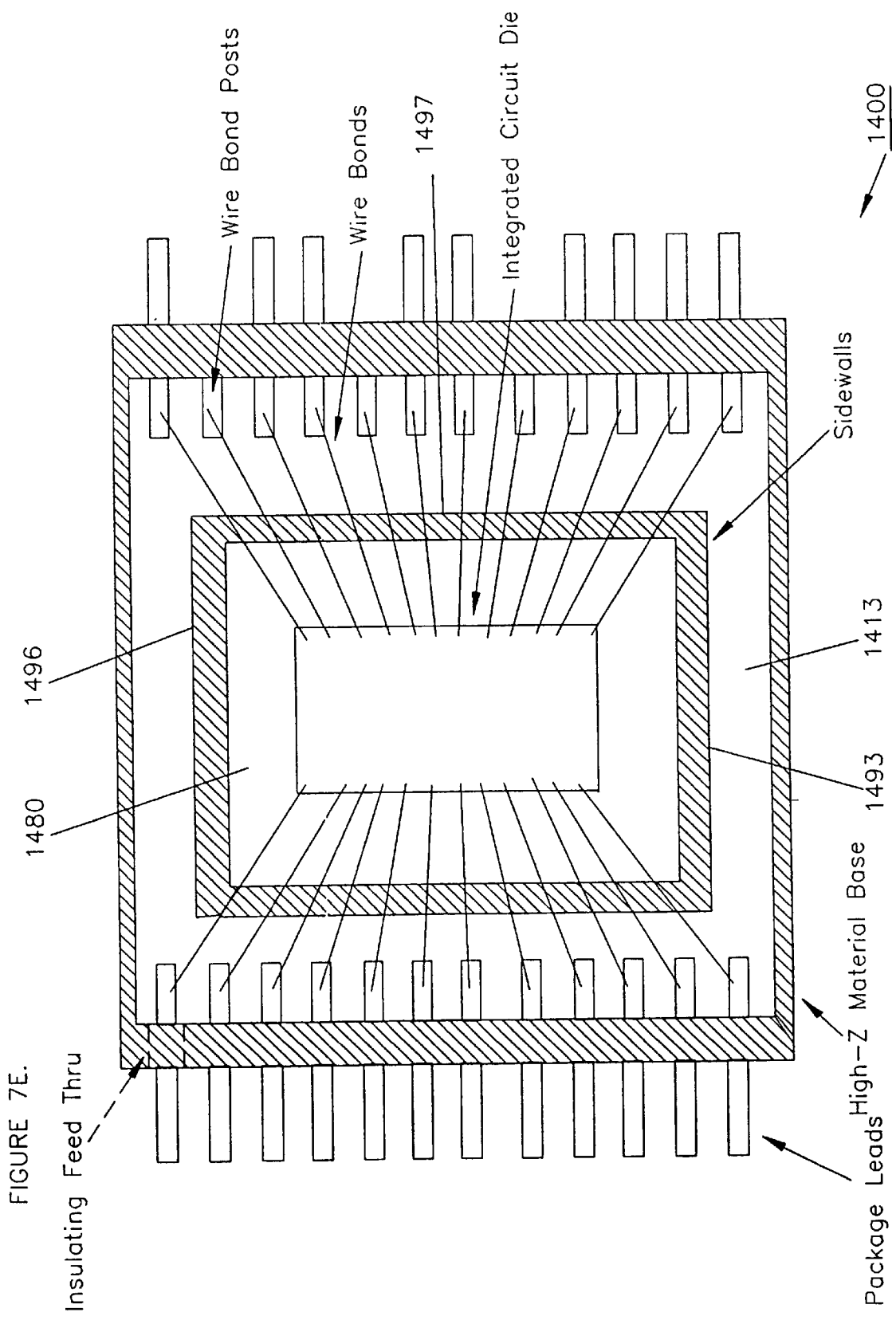
FIG. 7E is a cut-away plan view of a further radiation shielded and packaged integrated circuit device, which is also constructed in accordance with the present invention.
Figure 7F:
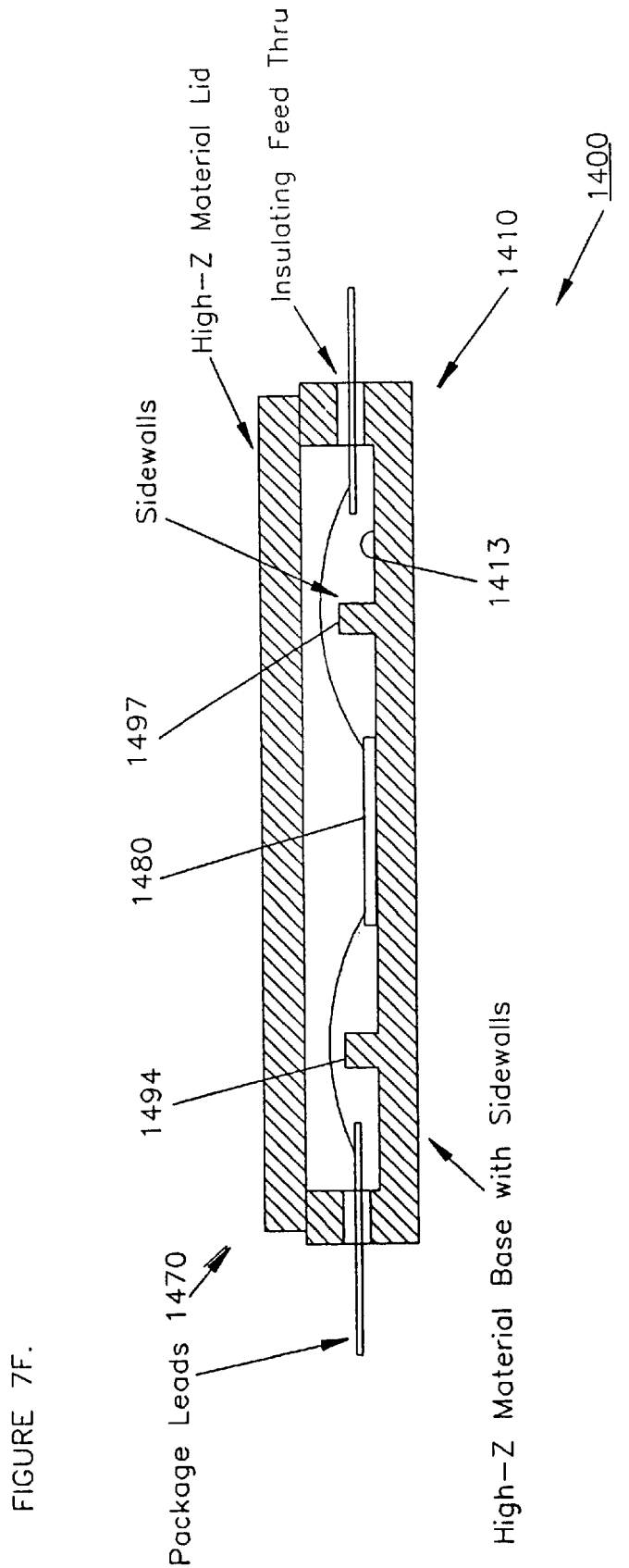
FIG. 7F is an elevational view of the device of FIG. 7E.

Referring now to FIGS. 7E and 7F, there is shown a radiation shielded package 1400 which is also constructed according to the present invention. The package 1400 is substantially similar to the package 500 (FIGS. 4C and 4D), with additional side wall members 1493, 1494, 1496 and 1497 secured to an inner surface 1413 for additional protection from side angle radiation. Although side wall members 1493, 1494, 1496 and 1497 are shown as connected end to end in a contiguous fashion, the use of only two oppositely disposed side wall members such as side wall members 1494 and 1497 may provide satisfactory side angle radiation protection. In this regard, some radiation may penetrate the sealed feed-throughs to strike the die 1480. By surrounding the die 1480 with the side wall members 1493, 1494, 1496 and 1497, a radiation barrier wall is formed and the ability for radiation penetrating the feed-throughs and striking the die 1480 insubstantially eliminated.

Referring now to FIGS. 8A, 8B, 9A, 9B, 10A, 10B, 11A and 11B, there are shown radiation shielded multi-chip module packages 1500, 1600, 1700 and 1800, which are constructed according to the present invention. The multi-chip module (MCM) packages 1500, 1600, 1700 and 1800 utilize the novel arrangement of high-Z materials, as described previously for packages enclosing only a single silicon integrated circuit die. The arrangements of the previously described packages have simply been expanded to encompass an MCM package, such as packages 1500, 1600, 1700 and 1800.

Figure 8A:
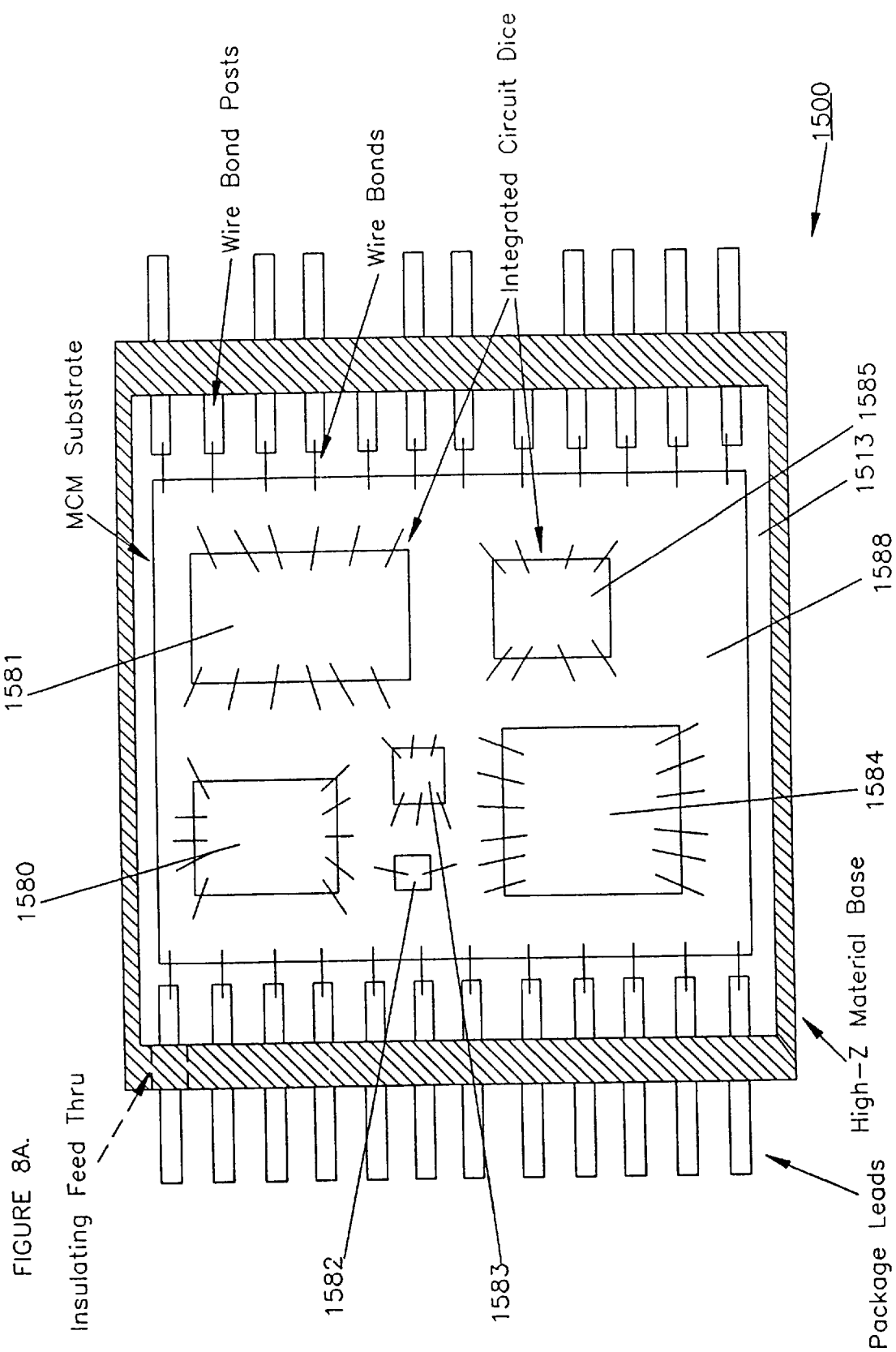
FIG. 8A is a cut-away plan view of a another radiation shielded and packaged integrated circuit device, which is also constructed in accordance with the present invention.
Figure 8B:
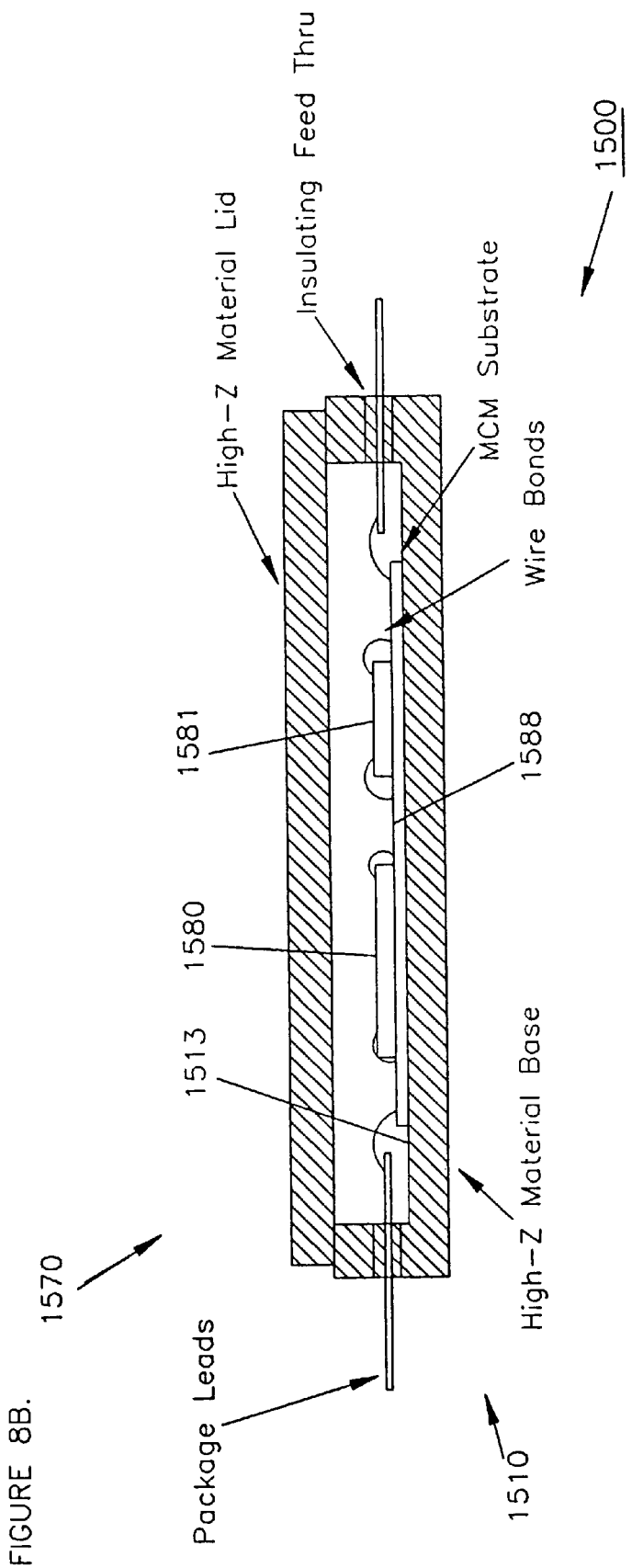
FIG. 8B is an elevational view of the device of FIG. 8A.
Figure 9B:
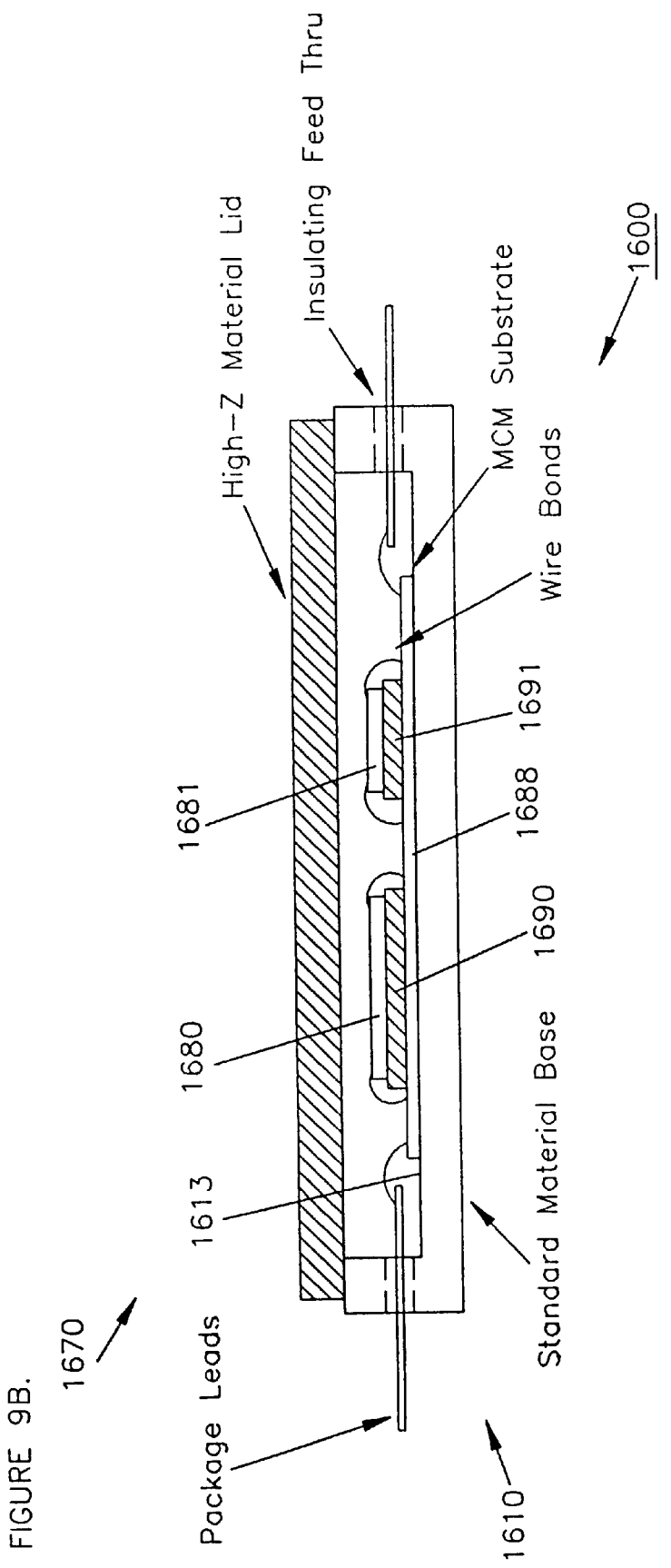
FIG. 9B is an elevational view of the device of FIG. 9A.

Considering now the MCM package 1500 in greater detail, with reference to FIGS. 8A and 8B, the package 1500 is substantially similar to the package 500 of FIGS. 4C and 4D. Similar to the package 500, the base 1510 and the lid 1570 of the package 1500 are constructed of a high-Z material. However, the package 1500 encloses multiple silicon integrated circuit dies, such as dies 1580, 1581, 1582, 1583, 1584 and 1585. A multi-chip module substrate 1588 is secured to an inner surface 1513 of the base 1510 to facilitate the use of multiple chip modules within the package 1500. The dies 1580, 1581, 1582, 1583, 1584 and 1585 are then secured to the MCM substrate 1588, wherein they are shielded from radiation by about 4π coverage Considering now the package 1600 in greater detail, with reference to FIGS. 9A and 9B, the package 1600 utilizes die attach slugs 1690, 1691, 1692, 1693, 1694 and 1695 in conjunction with a standard base 1610 to protect silicon integrated circuit dies 1680, 1681, 1682, 1683, 1684 and 1685, respectively, in a manner similar to that described for package 800 (FIGS. 5C and 5D). In this regard, each of the dies 1680, 1681, 1682,1683, 1684 and 1685 is disposed between a high-Z lid 1670 and an associated high-Z die attach slug 1690, 1691, 1692, 1693, 1694 and 1695.

Figure 10A:
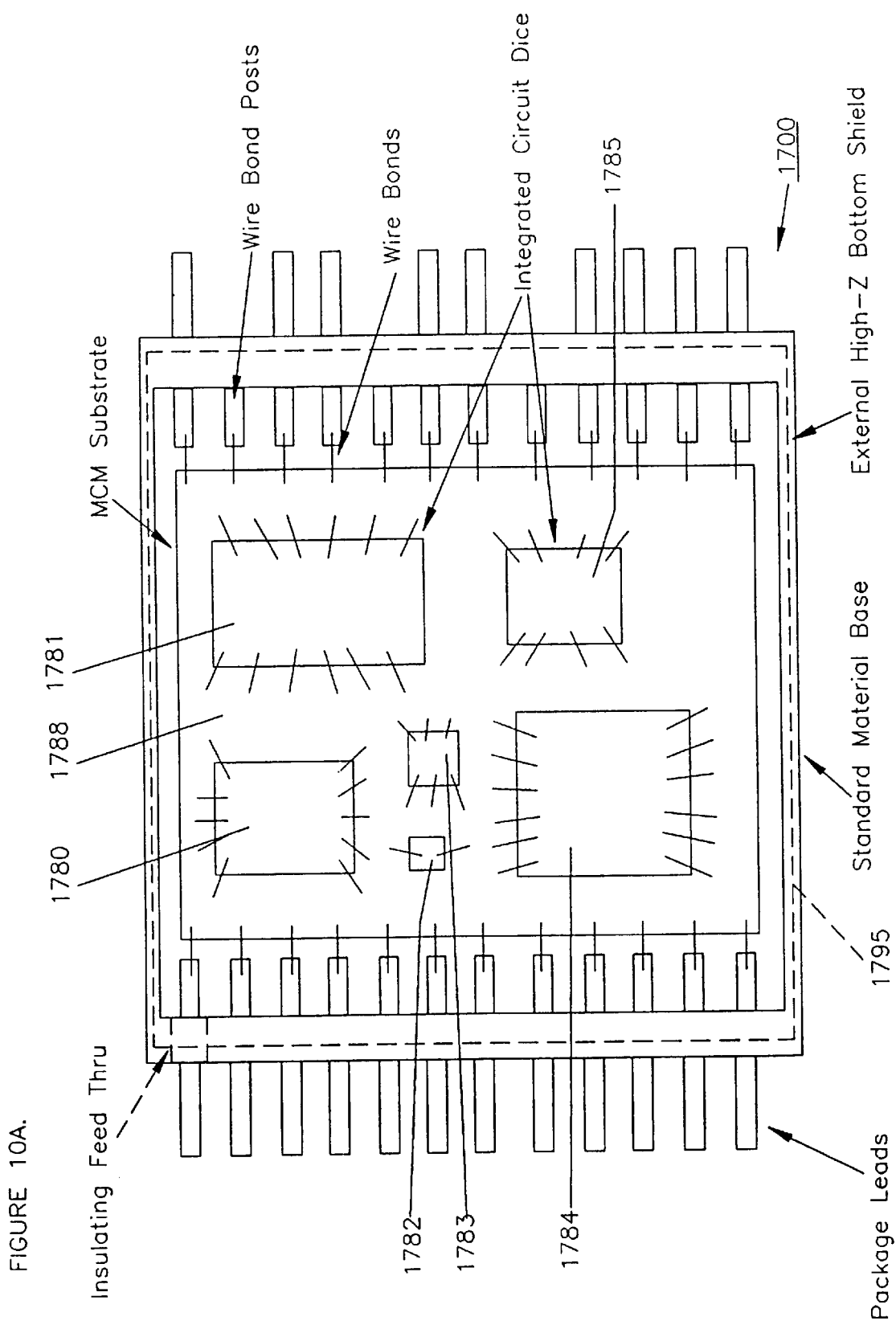
FIG. 10A is a cut-away plan view of a another radiation shielded and packaged integrated circuit device, which is also constructed in accordance with the present invention.
Figure 10B:
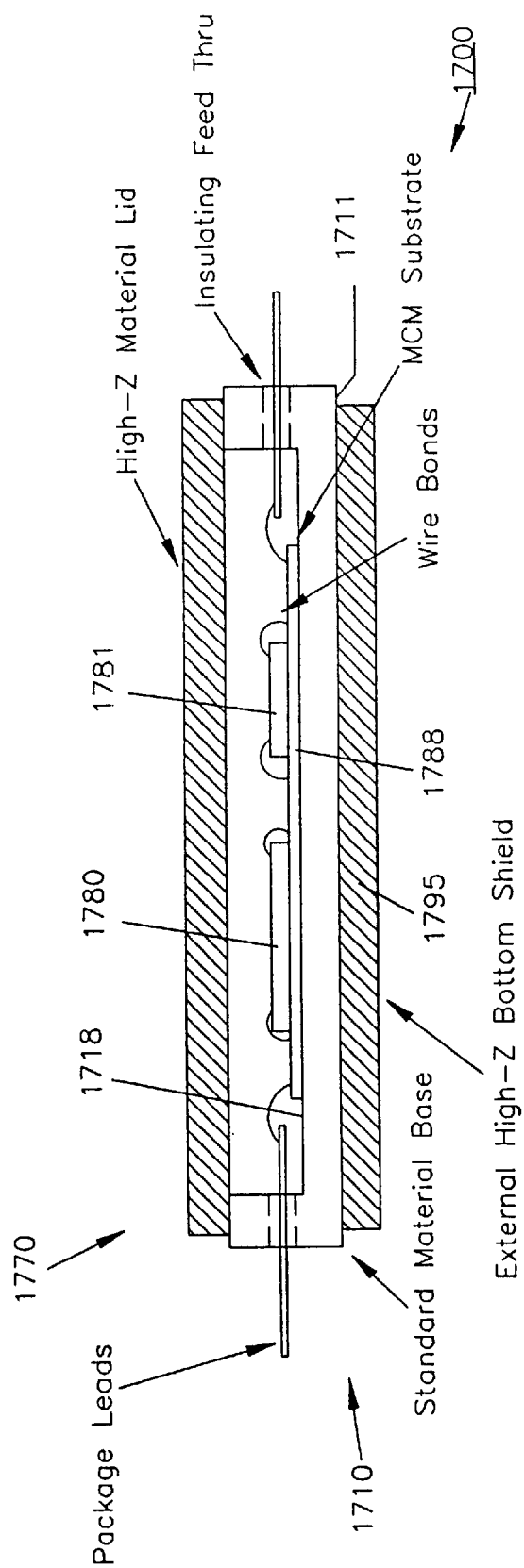
FIG. 10B is an elevational view of the device of FIG. 10A.

Considering now the package 1700, with reference to FIGS. 10A and 10B, the package 1700 is substantially similar to the package 1100 of FIGS. 6C and 6D. Unlike the package 1100, the package 1700 is adapted to accommodate multiple dies such as dies 1780, 1781, 1782, 1783, 1784 and 1785.

Figure 11A:
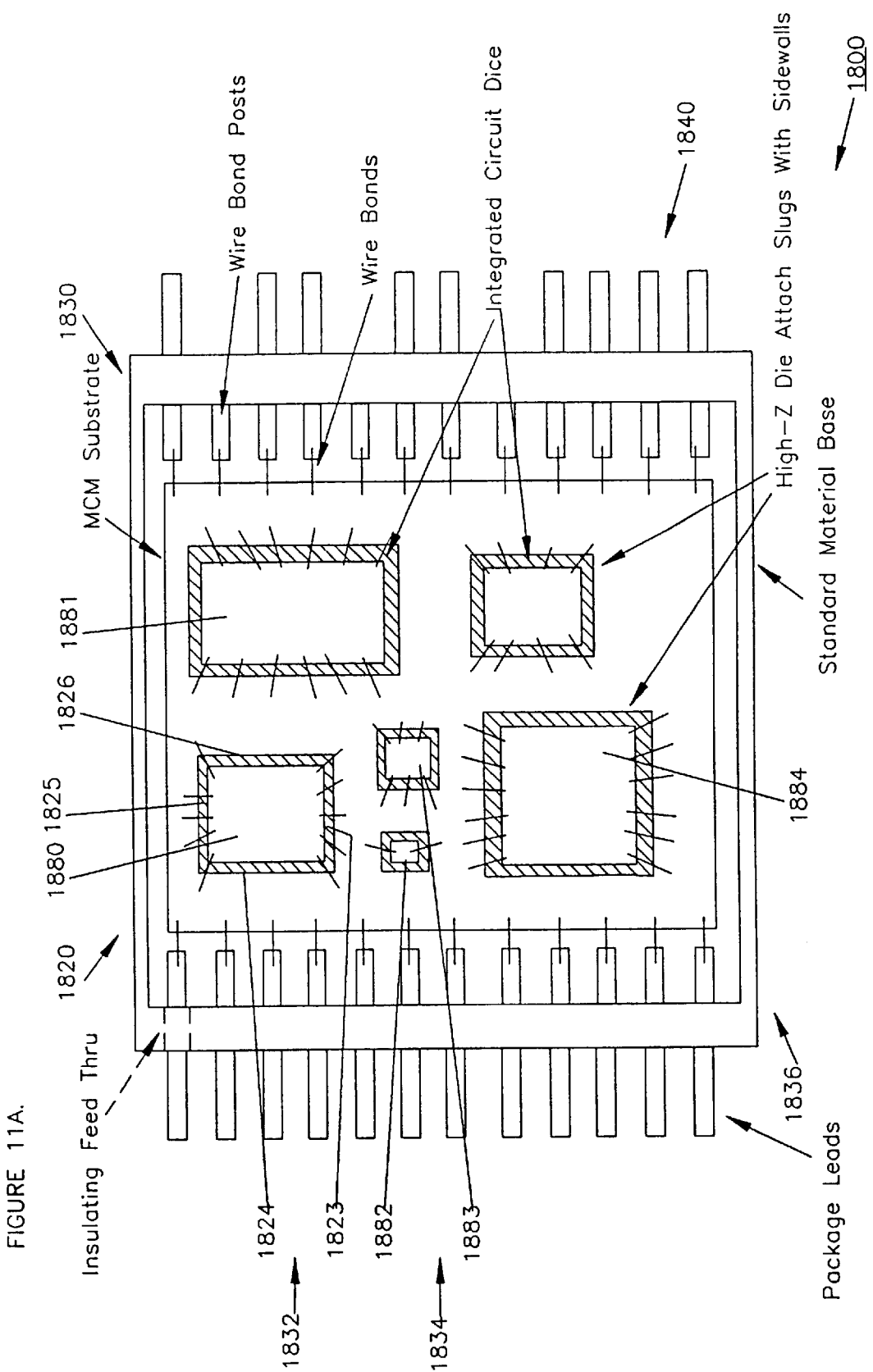
FIG. 11A is a cut-away plan view of another radiation shielded and packaged integrated circuit device, which is also constructed in accordance with the present invention.
Figure 11B:
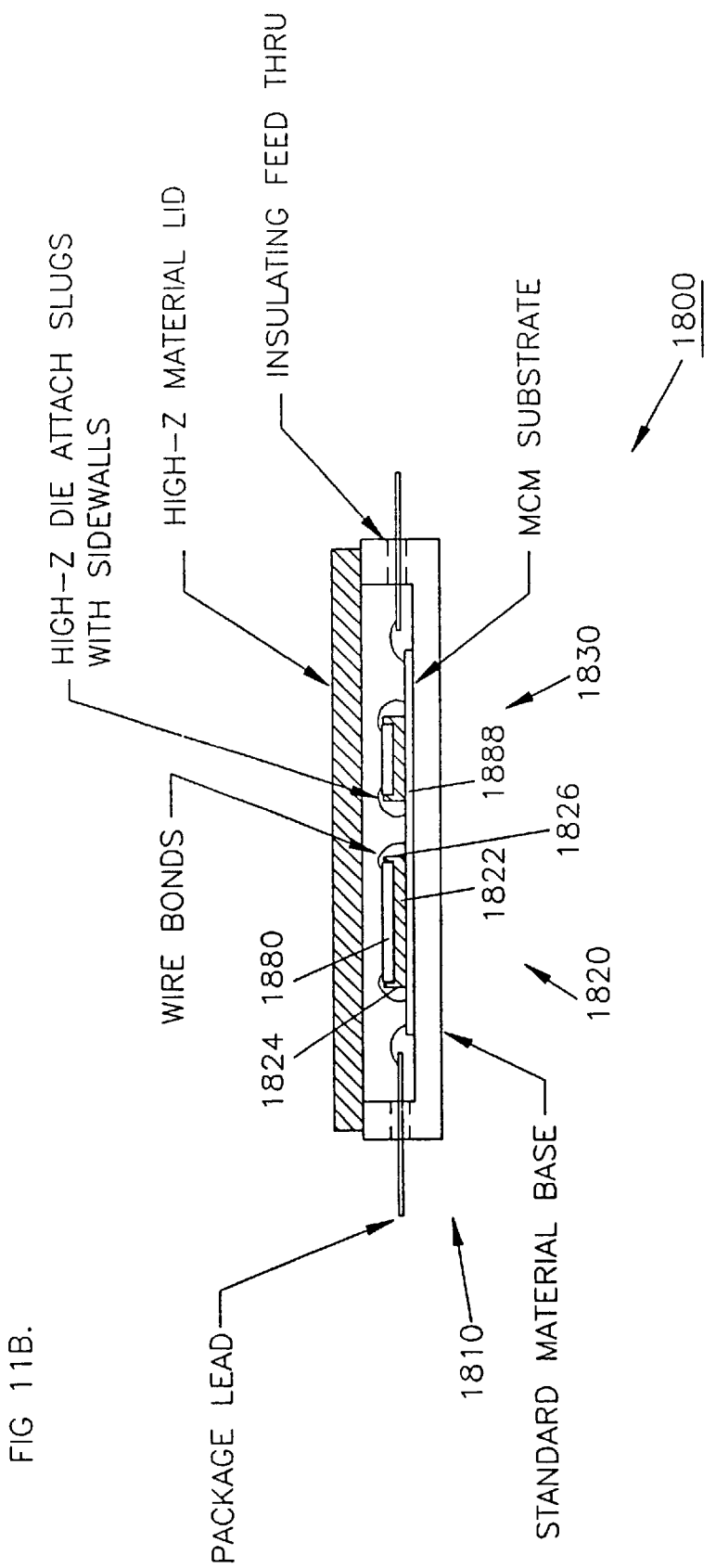
FIG. 11B is an elevational view of the device of FIG. 11A.

Considering now the package 1800, with reference to FIGS. 11A and 11B, the package 1800 is also adapted to accommodate multiple dies, such as dies 1880, 1881, 1882, 1883, 1884 and 1885. In this regard, the package 1800 utilizes high-Z die attach slugs 1820, 1830, 1832, 1834, 1836, 1838 and 1840 for protection of the dies 1880, 1881, 1882, 1883, 1884 and 1885 from radiation. As each of the die attach slugs 1820, 1830, 1832, 1834, 1836, 1838 and 1840 are substantially similar, only die attach slug 1820 will be considered hereinafter in greater detail.

The die attach slug 1820 is substantially similar to the die attach slug 1290 of FIGS. 7A and 7B, and includes a bottom member 1822 having contiguous side wall members 1823, 1824, 1825 and 1826 extending upwardly from the bottom member 1822. In this way, the die 1880 is protected from radiation with approximately $4\pi$ coverage.

It will be understood by one skilled in the art that the wire bonds described in the foregoing embodiments, especially those embodiments utilizing interior side wall members, could be insulated to accommodate the wire bond thickness and the operating conditions.

Custom Shield Material Formulations

The following procedure is employed for determining the optimal or at least preferred composition of shield material, to maximize or at least improve greatly the shielding effectiveness for a constant unit weight. The most effective composition is dependent upon the space application, specifically the orbit (e.g. low earth orbit, geostationary orbit or eccentric orbit). This dependency is due to the relative mix of trapped electrons, trapped protons, solar particles and cosmic rays in various trapped belts (e.g. Van Allen belts) or in various altitudes and inclinations, which provide differing levels of geomagnetic shielding. The total ionizing dose incident upon a spacecraft, and ultimately upon a sensitive integrated circuit, is comprised of the contributions from all such naturally occurring particles.

The optimal or preferred formulation/composition for a specific radiation shield can be expressed as:

$$F_{OPT}=X_{LZ}+Y_{HZ}$$

where, $X_{LZ}$=percentage, by weight, of low atomic number (Z) material (low Z is defined as material with Z<50; such as copper or aluminum);

$Y_{HZ}$=percentage, by weight, of high Z material (high Z is defined as material with Z>50; such as tantalum, tungsten or lead).

In general, the composition formulations are preferably determined with the aid of a conventional computer (not shown). According to the procedure, several assumptions are made. To illustrate the process, a simplified example will now be explained. One set of assumptions or approximations relates to the radiation environment. Firstly, there are various naturally occurring types of radiation particles, including electrons, protons, solar particles, cosmic rays and the like.

Secondly, the radiation environment includes various different energy levels, usually measured in millions of electron volts (MeV). For purposes of the inventive determination, the various energy levels are categorized in discrete groups or bins by the quantity of the energy level. In this regard, the first bin is defined to be all radiation emanating from particles between 0 and 1 MeV. The second bin is defined to be all radiation emanating from particles between 1 and 2 MeV. The remaining bins are similarly defined in increasing steps of 1 MeV each.

Assume only one bin of the radiation environment is present in the present simplified example, that is that the only radiation that exists has a level between 0 and 1 MeV. Other assumptions, for the purposes of this illustration only, are that only electrons and protons make up the radiation environment, and that all linear relationships exist.

To begin, in accordance with the inventive procedure, the stopping power of various high and low Z substances with respect to the expected energy level of radiation for a given space environment are considered. For the purposes of this illustration, only tungsten (high Z) and aluminum (low Z) will be considered. The radiation produced by the energy levels is expressed in rads (Si) relative to silicon, that is, the amount of radiation in rads absorbed by silicon. The stopping power of the materials is defined to be equal to the amount of radiation incident on the material minus the amount of radiation absorbed or shielded. This stopping power would be calculated for each type of radiation for electrons and protons, and with respect to each high Z and low Z substances selected to be tested.

In the present invention, considering electrons firstly, assume that they produce at this bin energy level, 100 rad (Si) of radiation, which when incident upon tungsten, caused 90 rad (Si) to be absorbed, and 10 rad (Si) to pass there through. In this regard, 100−90=10. Thus, the stopping power is equal to 10 rad (Si), which is equal to the radiation passing through the tungsten shield material.

Similarly, when the 100 rad (Si) is incident upon aluminum, 20 rad (Si) passes there through to provide a stopping power of 20 rad (Si). Thus, at this bin energy level, tungsten is preferred, because its stopping power (radiation out) is better, and thus tungsten is preferred for blocking electrons.

Next, the proton radiation is considered. Assuming 100 rad (Si) is incident on aluminum, 30 rad (Si) passes therefrom to determine the stopping power. Also, assuming 100 rad (Si) is incident onto tungsten, 50 rad (Si) stopping power results. As a result, aluminum has a preferred stopping power for protons at this energy level.

The next step is to add the stopping powers for tungsten by adding 10 and 50 to give a total of 60 rad (Si). The total stopping power for aluminum is then determined by adding 20 plus 30 to provide a total of 50 rad (Si).

Thus, it may be seen that 100% aluminum is preferred as being overall more effective for stopping both electrons and protons. Also, a combination of both tungsten and aluminum would overall be less effective. For example, 50% tungsten and 50% aluminum would provide an effective or combined stopping power of 55 rad (Si), which is half way between the stopping power of tungsten and aluminum. As a result, since 100% aluminum exhibits a stopping power of 50 rad (Si), 100% aluminum is preferred over a mixture of aluminum and tungsten.

This procedure can be extended to other shield materials and over particle radiation. The procedure is then performed for other bins of energy levels. A summation of all stopping powers of all bins is then determined to arrive at the preferred percentages of high-Z and low-Z materials for the final shield composition.

High Z materials are known to be more effective at stopping electrons and low Z materials are known to be more effective at stopping protons. The final composition exhibits the preferred stopping power relative to all form and sources of radiation with the least unit weight or density. The final high Z and low Z percentages are based by weight.

The generalized procedure for determining the percentages of low Z and high Z material for a specific application will now be considered.

1. Determine a breakdown (bin) of the radiation environment, by radiation type and energy level, and express the total radiation environment as:
where, $a_1$=amount of radiation between energy levels 0 to 1 MeV ($a_2$:between 1 and 2 MeV, $a_1$ between i−1 and i MeV);

$e_1$=radiation type, electrons;

$b_1$=amount of radiation between energy levels 0 to 1 MeV ($b_2$:between 1 and 2 MeV, $b_i$:between i−1 and i MeV);

$p_1$=radiation type, protons;

$c_1$=amount of radiation between energy levels 0 to 1 MeV ($c_2$:between 1 and 2 MeV, $c_i$:between i−1 and i MeV);

$t_1$=radiation type, solar particles;

$d_1$=amount of radiation between energy levels 0 to 1 MeV ($d_2$:between 1 and 2 MeV, $d_i$between i−1 and i MeV); and $r_1$=radiation type, cosmic rays.

$a_1$, $b_1$, $c_1$, and $d_1$, are constants for a given space environment and are found in space radiation models such as NASA's AP8 or AE8 space radiation models, used for determining the amount of radiation in a specific orbit. This space radiation model gives complete data for trapped electrons, trapped protons, solar flares and cosmic rays for given space application environment.

2. For each specific bin of radiation type and energy level (for example a. sub.i e.sub.i), determine the stopping power for each high Z and low Z Shielding material. The value of the stopping power is determined by the below equation by radiation transport calculations, through the desired materials, holding the weight of the material constant. Individual stopping power can be expressed as:

$$SP_{qm}=\text{(radiation in)}-\text{(radiation shielded)} \quad (3)$$

where, q=radiation type and energy bin (example: $a_1 e_1$); and m=material type, high and/or low Z.

3. Calculate the total weighted amount of radiation allowed through each material by material type and radiation type, using the following equations:

$$\Sigma SP(e_i,X)=a_1*SP_{e1X}+a_2*SP_{e2X}+\ldots+a_i*SP_{eiX} \quad (4)$$

$$\Sigma SP(e_i,Y)=a1*SP_{e1Y}+a_2*SP_{e2Y}+\ldots+a_b*SP_{eiY} \quad (5)$$

where,

X=low Z material, transported as m above.

Y=high Z material, transported as m above.

Repeat for all radiation types.

4. Adjust the percentages of materials X and Y which minimizes or at least greatly reduces the weighted sum of each energy bin stopping power, using the following expression:

$$\Sigma_{TOT}=\Sigma SP(_{ei},X)+\Sigma SP(_{ei},Y)+\Sigma SP(P_i,X)+\Sigma SP(p_i,Y)+\Sigma P(t_i,X)+=SP(t_i,Y)+\Sigma SP(r_i,X)+\Sigma SP(r_i,Y). \quad (6)$$

Preferred shield material formulations include high atomic number substances include tungsten, tantalum and lead, and low atomic number substances include copper, aluminum and silicon. Examples of formulations for radiation protection of integrated circuits in space platforms generally contain between about 80% by weight and about 90% by weight high atomic number material and between about 10% by weight and about 20% by weight low atomic number material. The following are examples of preferred shield compositions:

EXAMPLE 1

Tungsten 90% by weight

Copper 10% by weight

EXAMPLE 2

Tungsten 80% by weight

Copper 20% by weight

EXAMPLE 3

Tungsten 85% by weight

Copper 15% by weight

To fabricate the shield members, sheets of the high and low Z materials can be laminated together in the proper proportions. Alternatively, the shield members may be fabricated by admixing the preferred proportions of powdered high Z and low Z substances together. The high Z and low Z substances are then compressed and stamped. The heat generated by this process leads to heat binding of the radiation shield member components.

Any high Z material may be used with any low Z material, and one or more, including three or more such materials can be combined. Three or even four different substances, or more, may be combined to satisfy the preferred composition for the shield member.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A radiation shielding circuit device comprising:

an ionizing radiation shielding top;

a base;

an electronic circuit device coupled to the base;

a side wall coupled to the ionizing radiation shielding top and to the base;

an ionizing radiation shield coupled to the base opposite the electronic circuit device from the ionizing shielding top; and a plurality of conductors electrically coupling the electronic circuit device to a plurality of leads;

wherein the ionizing radiation shielding top and the ionizing radiation shield together shield the electronic circuit device from ionizing radiation, wherein the radiation shielding top and the ionizing radiation shield each comprises a high Z material and a low Z material;

wherein the thicknesses of the radiation shielding top and the ionizing radiation shield are such that the electronic circuit device receives an amount of ionizing radiation less than a total dose tolerance for the electronic circuit device; and wherein said low Z material comprises at least one of aluminum, silicon and copper.

2. The apparatus of claim 1 further comprising an inner ionizing radiation shielding wall.

3. The apparatus of claim 1 wherein the ionizing radiation shield is juxtaposed against an outer surface of the base.

4. The apparatus of claim 1 further comprising a plurality of feedthroughs through which the plurality of leads pass.

5. A radiation shielding circuit device comprising:

an ionizing radiation shielding top;

a base;

an electronic circuit device coupled to the base;

a ionizing radiation shielding bottom coupled to the base;

a side wall coupled to the ionizing radiation shielding top and to the base;

a plurality of leads;

a plurality of conductors electrically coupling the electronic circuit device to the plurality of leads;

wherein the ionizing radiation shielding top and the ionizing radiation shielding bottom shield the electronic circuit device from ionizing radiation and comprise a high Z material and a low Z material;

wherein the shielding of the electronic circuit device comprises a thickness such that the electronic circuit device receives an amount of ionizing radiation less than a total dose tolerance for the electronic circuit device; and wherein said low Z material comprises at least one of aluminum, silicon and copper.

6. The apparatus of claim 5 further comprising an inner ionizing radiation shielding wall.

7. The apparatus of claim 6 wherein said inner ionizing radiation shielding wall is coupled to an interior surface of said base.

8. The apparatus of claim 6 wherein said ionizing radiation shielding top comprises copper tungsten alloy, and further wherein said ionizing radiation shielding bottom comprises copper tungsten alloy.

9. The apparatus of claim 6 wherein said ionizing radiation shielding top comprises tantalum, and further wherein said ionizing radiation shielding bottom comprises tantalum.

10. The apparatus of claim 5 wherein the ionizing radiation shielding bottom is juxtaposed against an outer surface of the base.

11. The apparatus of claim 5 further comprising a plurality of feedthroughs through which the plurality of leads pass.

12. The apparatus of claim 11 wherein said plurality of feedthroughs comprise a plurality of insulating feedthroughs.

13. The apparatus of claim 5 wherein said base comprises a ceramic.

14. The apparatus of claim 5 wherein said ionizing radiation shielding top comprises copper tungsten alloy, and further wherein said ionizing radiation shielding s bottom comprises copper tungsten alloy.

15. The apparatus of claim 14 wherein said ionizing radiation shielding top comprises from between about 80% and 90% tungsten, by weight.

16. The of claim 14 wherein said ionizing radiation shielding top comprises from between about 10% and 20% copper, by weight.

17. The apparatus of claim 5 wherein said ionizing radiation shielding top comprises tantalum, and further wherein said ionizing radiation shielding bottom comprises tantalum.

18. The apparatus of claim 5 wherein said ionizing radiation shielding bottom is sized to be larger than said electronic circuit device.

19. The apparatus of claim 5 wherein said side wall comprises a ceramic.

20. A radiation shielding circuit device comprising:

an ionizing radiation shielding top;

a base;

an electronic circuit device coupled to the base;

a side wall coupled to the ionizing radiation shielding top and to the base;

an inner ionizing radiation shielding wall;

an ionizing radiation shield coupled to the base opposite the electronic circuit device from the ionizing shielding top; and a plurality of conductors electrically coupling the electronic circuit device to a plurality of leads;

wherein the ionizing radiation shielding top, the inner ionizing radiation shielding wall, and the ionizing radiation shield together shield the electronic circuit device from ionizing radiation;

wherein the ionizing radiation shielding top, the inner ionizing radiation shielding wall, and the ionizing radiation shield each comprises a high Z material and a low Z material;

wherein the thicknesses of the ionizing radiation shielding top, the inner ionizing radiation shielding wall, and the ionizing radiation shield are such that the electronic circuit device receives an amount of ionizing radiation less than a total dose tolerance for the electronic circuit device; and wherein the ionizing radiation shield is juxtaposed against an outer surface of the base.

\* \* \* \* \*